(12) United States Patent
Wu et al.

(10) Patent No.: US 7,085,122 B2
(45) Date of Patent: Aug. 1, 2006

(54) MEMS TUNABLE CAPACITOR BASED ON ANGULAR VERTICAL COMB DRIVES

(75) Inventors: Ming C. Wu, Pacific Palisades, CA (US); Hung D. Nguyen, Los Angeles, CA (US); Doo-Young Hah, Daejeon (KR); Pamela R. Patterson, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 4 days.

(21) Appl. No.: 10/850,958

(22) Filed: May 21, 2004

(65) Prior Publication Data

US 2005/0013087 A1    Jan. 20, 2005

Related U.S. Application Data

(60) Provisional application No. 60/472,696, filed on May 21, 2003.

(51) Int. Cl.
*H01G 7/00* (2006.01)

(52) U.S. Cl. ............... 361/277; 361/272; 361/278; 361/287; 361/290; 361/292; 333/134; 333/135; 333/174

(58) Field of Classification Search ........ 361/272–273, 361/277, 278, 279–290, 292; 333/134–135, 333/174, 209
See application file for complete search history.

(56) References Cited

U.S. PATENT DOCUMENTS

| | | | | |
|---|---|---|---|---|
| 5,636,099 A | * | 6/1997 | Sugawara et al. | 361/278 |
| 5,640,133 A | * | 6/1997 | MacDonald et al. | 333/197 |
| 5,901,031 A | * | 5/1999 | Ishige et al. | 361/277 |
| 6,683,513 B1 | * | 1/2004 | Shamsaifar et al. | 333/135 |
| 6,690,568 B1 | * | 2/2004 | Johnson | 361/277 |

* cited by examiner

*Primary Examiner*—Nguyen T. Ha
(74) *Attorney, Agent, or Firm*—John P. O'Banion

(57) ABSTRACT

A MEMS tunable capacitor with angular vertical comb-drive (AVC) actuators is described where high capacitances and a wide continuous tuning range is achieved in a compact space. The comb fingers rotate through a small vertical angle which allows a wider tuning range than in conventional lateral comb drive devices. Fabrication of the device is straightforward, and involves a single deep reactive ion etching step followed by release and out-of-plane assembly of the angular combs.

28 Claims, 23 Drawing Sheets freq (45.00MHz to 20.00GHz)

freq (45.00MHz to 20.00GHz)

freq (45.00MHz to 5.000GHz)

freq (45.00MHz to 5.000GHz)

freq (45.00MHz to 5.000GHz)

freq (45.00MHz to 5.000GHz)

MEMS TUNABLE CAPACITOR BASED ON ANGULAR VERTICAL COMB DRIVES

CROSS-REFERENCE TO RELATED APPLICATIONS

This application claims priority from U.S. provisional application Ser. No. 60/472,696 filed on May 21, 2003, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to MEMS capacitors, and more particularly to a MEMS tunable capacitor that employs an angular vertical comb drive.

2. Description of Related Art

Research in wireless communication devices has exploded exponentially with the increase in demand for smaller, cheaper, and more powerful portable cellular handsets. In the past p-n junctions (varactors) have been traditionally used in wireless communications as tunable capacitors for frequency control, filtering, and synthesizers. However, their drawbacks have led to research in Micro-Electro-Mechanical Systems (MEMS) as a possible alternative technology in RF and microwave systems.

Generally, the use of MEMS-based tunable capacitors can substantially increase the tuning range (>30%), provide higher Q's, and can tolerate higher voltage swings while consuming less power. MEMS devices therefore provide inherent performance advantages over conventional solid-state varactors. Additionally, as MEMS tunable capacitors exhibit a low mechanical resonance frequency, harmonic distortion is no longer a concern. If a large tuning capability can be provided, a MEMS tunable capacitor can be integrated in an array of military and commercial applications such as wireless systems.

MEMS tunable capacitors (varactors) can replace p-n junctions as frequency controllers to generate and filter transmitting and receiving signals. They can also be used as phase shifters in phased-array antennae. Although MEMS capacitors can provide superior performance over conventional devices, they are not expected to achieve widespread commercial use unless fabrication can be made more cost-effective.

The capacitance of a MEMS varactor can be varied by either moving the dielectric between the conductors, or changing the spacing or overlap area between the conductors. Several actuation mechanisms have been reported, including thermal, piezoelectric, or electrostatic actuation. Electrostatically-driven varactors have received the most attention because of their low power consumption, fast response time, and ease of control due to hysteresis-free tuning. The simplest type of tunable capacitor consists of a pair of parallel plate conductors whose spacing is varied by applying a dc voltage. This is often called a gap-closing actuator.

Most of the attention has been directed toward MEMS tunable capacitors employing gap-closing electrostatic actuation between two parallel plates. This design offers relatively short response times with a low power dissipation and little or no heat generation. However, these gap-closing actuators also suffer from some fundamental limitations. For example, these devices exhibit highly nonlinear actuation and also exhibit a pull-in phenomenon at about one third of the gap distance between conductors, which limits the tuning ratio to about 1.5:1 (50%). There have been several attempts to overcome this theoretical limit via modifications to the gap-closing design. Nevertheless, the tuning ratios achieved are still very modest.

There have been attempts to overcome this theoretical limit by employing different gap spacings for the actuator and the capacitor, or using a push-pull geometry. One researcher achieved a tuning range of 69% while another group was able to obtain an 87% change in capacitance with this approach. However, these modifications demonstrate only moderate increases. Separation of the sensing electrodes and actuating electrodes on these parallel plate capacitors has yielded a tuning range to 600%.

In recent years, lateral comb drive actuators are receiving increasing attention as a superior alternative to gap-closing actuators. The use of lateral comb drive actuators has made it possible to achieve a tuning ratio of 8.4 to 1 with low operating voltages. While lateral comb drives do not suffer from pull-in, the capacitance tuning relies on the lateral motion of the movable fingers. Hence, the tuning ratio is limited by the maximum separation of these fingers and their overall lengths, which has the negative effect of increasing overall device size.

FIG. 1 depicts an example of a conventional MEMS tunable capacitor with laterally interdigitating fingers which provide a maximum capacitive tuning range of about 740% (8.4:1). The tuning occurs by electrostatically displacing the movable comb, whose fingers are laterally displaced in relation to the fingers of the stationary comb.

Despite the advantages of MEMS tunable capacitors, a fundamental limit exists for lateral comb drive devices; the lengths of the sensing fingers must be shorter than the total displacement of the comb drives. Thus optimum tuning and maximum capacitance value require a large device area and/or comb finger thickness. The larger device size reduces the ability to effectively integrate the MEMS device into microwave systems.

Therefore, a need exists for a MEMS tunable capacitor configuration that has a wide tuning range, requires less physical circuit space than conventional MEMS tunable capacitors, and which can be readily fabricated. The present invention satisfies those needs, as well as others, and overcomes inherent deficiencies in current MEMS tunable capacitor designs.

BRIEF SUMMARY OF THE INVENTION

MEMS tunable capacitors in accordance with the present invention employ an angular vertical comb (AVC) structure with a variable level of interdigitation between the combs. This new device configuration fully appreciates the drawbacks inherent in lateral drive MEMS capacitors, and provides substantial improvements, such as increased tuning range.

By way of example, the MEMS AVC tunable capacitor is based on the use of angular vertical comb actuators, which generate rotational motion instead of linear displacements. In the AVC tunable capacitor a small out-of plane rotation results in a large offset between the comb electrodes. The AVC tunable capacitor also allows for continuous rotation without pull-in. As a result the dependence on device area for maximum performance is of less concern than with lateral motion MEMS tunable capacitors. Thus, the AVC tunable capacitor provides a large continuous tuning range which can be realized in a compact device. Tuning ratios of as much as 31:1 have been achieved for these tunable capacitors, far exceeding the prior 7:1 ratio achieved for lateral motion MEMS capacitors. The AVC tunable capacitors can be actuated with low actuation voltage (i.e. 10 V swing) and exhibit a high Q (i.e. 55 at 200 MHz).

The angular comb drive is configured for rotating a movable comb to alter the proportion of the rotating electrode fingers which are interposed (interdigitated) between the stationary electrode comb fingers. These AVC tunable MEMS capacitors can be readily fabricated and require only two mask steps, for example a single deep reactive ion etching step followed by release and out-of-plane assembly of the angular combs. A novel self-assembly process is described for establishing an initial comb finger angle.

Actuation of the angular comb device can be achieved by a number of different mechanisms. For example, in a vertical angular comb drive having a single set of interposed electrode fingers, the capacitance can be tuned by varying the bias voltage applied between the opposing electrode combs which create electrostatic forces that deflect the movable comb to vary the extent of interdigitation and thus the capacitance between the movable and static electrode combs.

In another example, an actuation means is coupled to the movable comb to drive the angular displacement of the fingers. In one embodiment a second set of combs (DC combs) is utilized wherein a bias voltage applied across the actuation combs displaces the rotational comb and drives the position of the other rotational comb (within the RF combs) to establish the amount of capacitance.

According to an aspect of the invention, a MEMS tunable capacitor comprises: a first plurality of spaced apart electrode fingers; a second plurality of spaced apart electrode fingers configured for positioning between the first plurality of electrode fingers; and means for moving the second electrode fingers between a position wherein the electrode fingers are interdigitated and a position wherein the electrode fingers are non-interdigitated. The first and second plurality of electrode fingers are coupled to one another through a hinge. In one embodiment, the first and second electrode fingers provide the means for moving the electrode fingers between the interdigitated and non-interdigitated positions in response to the application of a bias voltage. In another embodiment a separate actuator is utilized for driving the movement of the capacitor electrode fingers. The actuator preferably comprises a second set of electrode combs (DC or driver electrode), with the movable portions of the driver electrode and the capacitor electrodes coupled by means of a hinge. In one embodiment the actuator operates against a mechanical bias force, such as a torsional element.

According to another aspect of the invention, the tunable capacitor comprises: a set of sensing electrodes; and a set of driving electrodes. The sensing electrodes and driving electrodes each having a plurality of electrode fingers. The driving electrode fingers are movable between a non-interdigitated position and an interdigitated position, while the sensing electrode fingers are movable between an interdigitated position and a non-interdigitated position. The movement of the driving electrode fingers between non-interdigitated and interdigitated positions causes movement of the sensing electrode fingers between interdigitated and non-interdigitated positions.

According to another aspect of the invention a method for fabricating a tunable capacitor comprises: forming a silicon-on-glass wafer by bonding a silicon-on-insulator (SOI) wafer to a glass wafer; removing the SOI material by a combination of mechanical and chemical etches until a silicon film remains; patterning and etching the remaining silicon film to form a device structure; patterning photosensitive Cyclotene resist (BCB) hinges to physically connect suspended sensing and floating driving fingers; etching the glass substrate to release the suspended fingers; and assembling movable DC comb fingers to an initial angle above the substrate plane.

The invention provides numerous beneficial aspects, a number of which are outlined below.

An aspect of the invention is to provide a MEMS tunable capacitor that can be used in numerous applications, such as in microwave (RF) circuits.

Another aspect of the invention is to provide a MEMS tunable capacitor that has a wide tuning range.

Another aspect of the invention is to provide a MEMS tunable capacitor that requires a small circuit footprint.

Another aspect of the invention is to provide a MEMS tunable capacitor that can be used in a variety of RF circuits, such as filters and voltage controlled oscillators.

Another aspect of the invention is to provide a MEMS tunable capacitor that employs an angular vertical comb drive where capacitance is varied by rotating a comb conductor.

Another aspect of the invention is to provide a MEMS tunable capacitor in which interdigitation within a first set of electrode combs is controlled by a voltage applied to move a second set of electrode combs.

Another aspect of the invention is to provide a MEMS tunable capacitor in which a movable electrode finger comb within a first set of electrode combs is attached by a hinge to the movable electrode finger comb within a second set of electrode combs.

Another aspect of the invention is to provide a MEMS tunable capacitor in which the electrode finger combs are covered with a deposited metallic layer.

Another aspect of the invention is to provide a MEMS tunable capacitor in which the hinge comprises photosensitive BCB polymer (Cyclotene™).

Another aspect of the invention is to provide a MEMS tunable capacitor that can be readily fabricated with few process steps.

Another aspect of the invention is to provide a MEMS tunable capacitor in which the initial positions of the movable devices are determined in response to self-assembly techniques.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in FIG. 2 through FIG. 26. It will be appreciated that the apparatus may vary as to configuration and as to details of the parts, and that the method may vary as to the specific steps and sequence, without departing from the basic concepts as disclosed herein.

Instead of relying on increasing and decreasing the depth of electrode finger interposition for tuning, as is accomplished within conventional MEMS lateral comb drive actuators, the present invention comprises a comb drive configured for angular displacement to change interdigitation and thus the exhibited capacitance. This new class of tunable capacitors is referred to herein as AVC tunable capacitors.

This section describes AVC tunable capacitors including results from our ongoing development of these devices. It will be appreciated that the later developed AVC capacitors achieved higher tuning ratios and Q's than the earlier devices. The earlier work is described first within the present application. The more recent work resulted in an AVR tuning capacitor having a tunable range of over 3000%, which substantially exceeds the limits for lateral tuning MEMS capacitors. Further improvement to the tuning ratio and other factors are anticipated as development continues.

Figure 1:
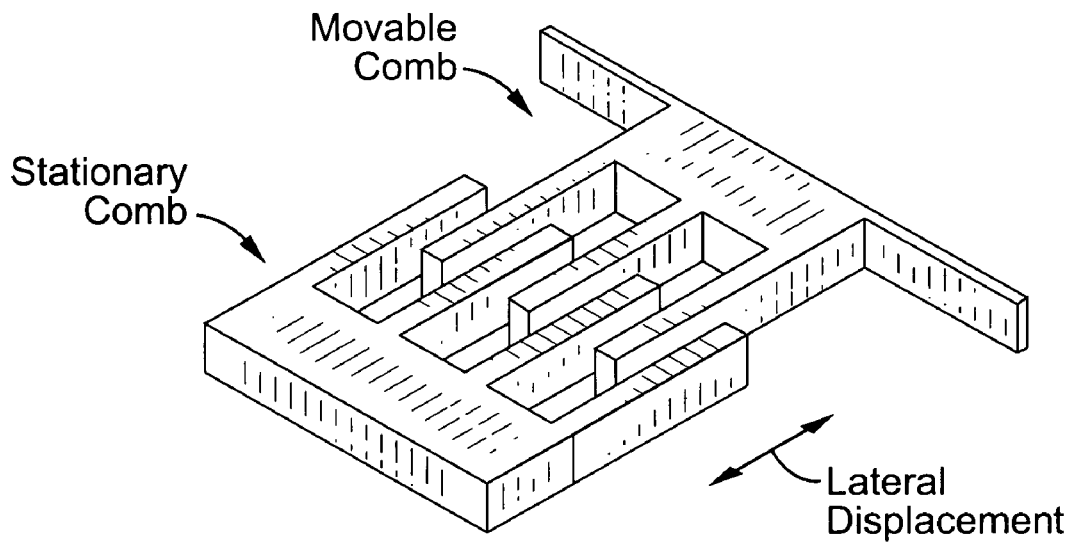
FIG. 1 is a perspective view of a conventional lateral comb drive in which tuning varies in response to the lateral movement of the electrode fingers of a movable comb which are interposed between the electrode fingers of a stationary comb.
Figure 2:
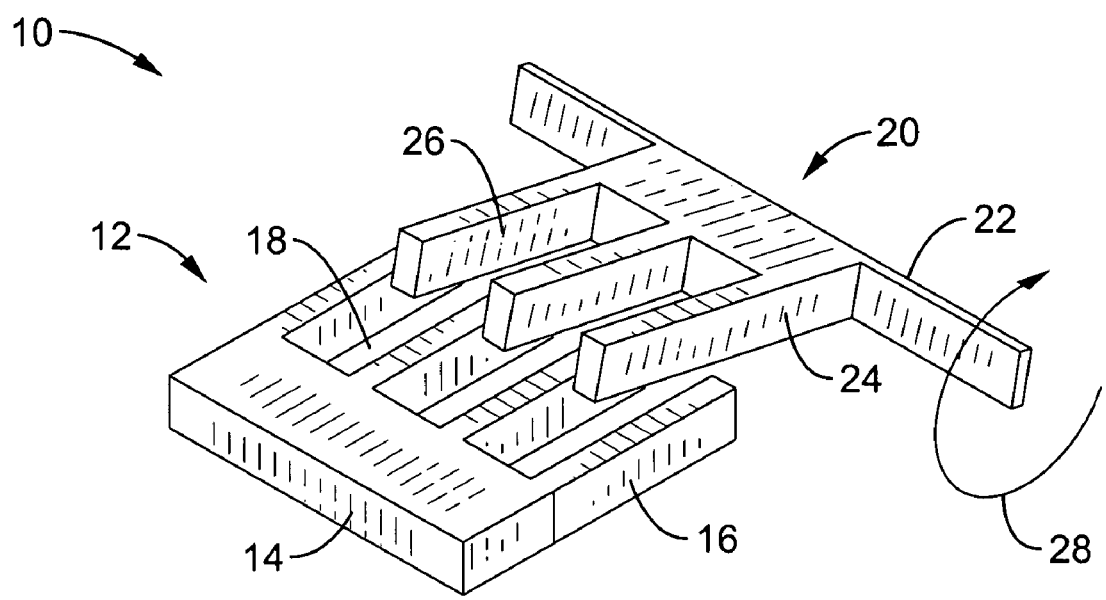
FIG. 2 is a perspective view of an angular vertical comb (AVC) tunable capacitor according to an embodiment of the present invention, and shown with the movable comb being rotated out of the plane of the stationary comb.

FIG. 2 depicts an embodiment 10 of an angular vertical comb (AVC) tunable capacitor according to the invention. This embodiment illustrates a single comb pair design which functions as both actuator and capacitor. Alternate embodiments are described later which utilize actuator means which are separate from the capacitive comb pair.

Illustrated in the figure are a stationary comb 12 with a base 14 from which electrode fingers 16 extend leaving gaps 18 configured for receiving the fingers from a movable comb 20. The movable comb 20 is shown having a base 22, fingers 24 and gaps 26 between the fingers which are wider that the width of the fingers of the stationary comb 12. It will be appreciated that the fingers of the interposed combs form the parallel plates of a capacitor and that rotating 28 movable comb 20, to change its angle in relation to stationary comb 12, changes the capacitance exhibited by the device.

In this embodiment, movable comb 20 is displaced in relation to stationary comb 12 in response to electrostatic forces which result from applying a bias voltage between the stationary comb 12 and movable comb 20. For example, the movable comb may be mechanically biased to a first position, such as shown in FIG. 2, wherein upon applying a bias voltage the movable comb is directed by electrostatic force to a second position. In FIG. 2, the movable comb is shown biased in a low capacitance position, wherein application of a bias voltage pulls the movable comb 20 down toward increased engagement with stationary comb 12. The extent of rotation being a function of the applied voltage, the mechanical bias applied at the hinge line of the rotatable comb 20, and the distances and surface areas of the fingers of the respective combs.

A MEMS tunable capacitor with a vertical angular comb drive according to the present invention can be readily fabricated, and continuous tuning ranges have been achieved which far exceed those of lateral motion MEMS capacitors. By way of example, and not of limitation, a MEMS tunable capacitor according to the present invention can be fabricated using a two-mask fabrication and a batch self-assembly process to position the driving electrodes to their prescribed angle above the substrate. In one embodiment, the self-assembly process utilizes reflowed Cyclotene™ polymer via surface tension, wherein the material lifts the driving electrode to the initial rotation angle. Cyclotene™ is a class of resins derived from B-staged bisbenzocyclobutene (BCB) monomers and marketed under the Cyclotene™ trademark by Dow Chemical®. Traditionally, the BCB polymer material is utilized as a planarization material or an insulating dielectric. This is perhaps the first time that BCB has been used as an assembly mechanism. It should be appreciated that other existing materials or new material formulations may be created by one of ordinary skill in the art and used according to the teachings herein without departing from the present invention.

In one embodiment of the invention the use of self-assembly processes dramatically reduces the labor normally required to assemble these MEMS devices, wherein large batches of the devices can be readily fabricated. As the fabrication process can be executed with fewer mask layers, the production cost is reduced. Furthermore, unlike previous designs, the AVC tunable capacitor relies on the rotation of the comb fingers to tune the capacitance thereby reducing its dependence on the device area for larger tuning range.

The present invention is amenable to a number of different embodiments which can each provide unique benefits for satisfying a wide range of applications. By way of further example, a AVC tunable capacitor can be fabricated which utilizes a separate rotation actuator means for driving the angular displacement of the electrode fingers of the movable comb. In one preferred embodiment, the actuator comprises another set of interposed combs in which the movable comb of the actuator element is coupled to the movable comb of the tunable capacitor, wherein a first half of the device drives the second half of the device.

Figure 3A:
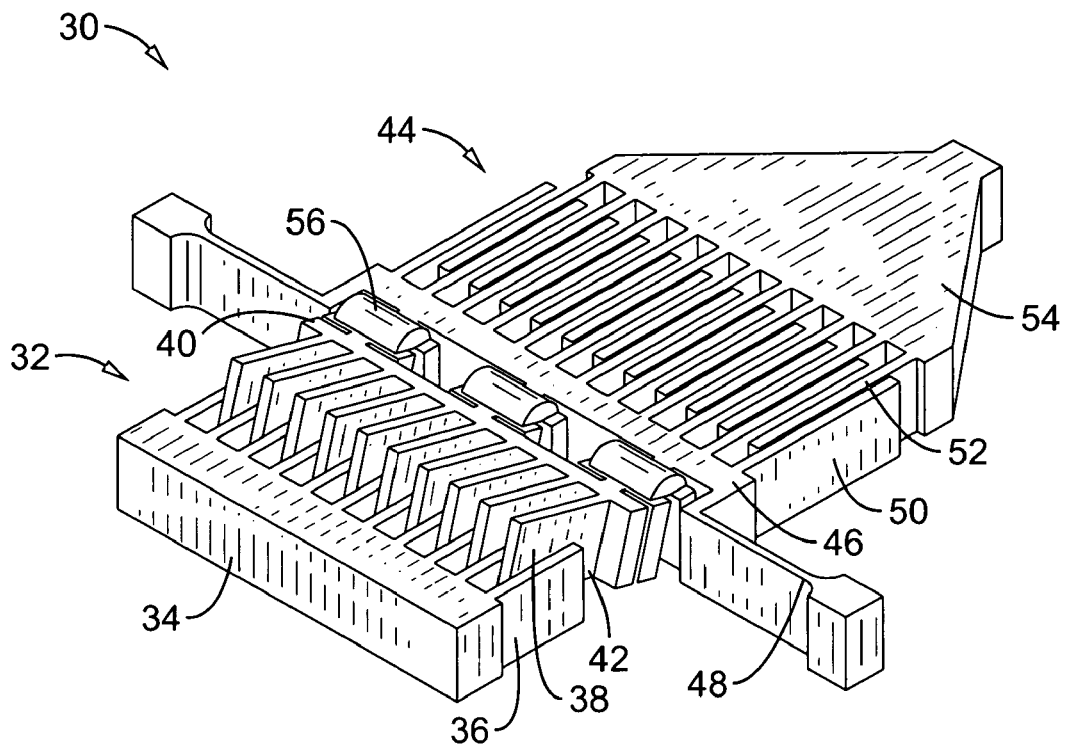
FIGS. 3A and 3B are perspective views of an AVC tunable capacitor with a separate actuator means fabricated according to an aspect of the present invention, shown with a comb style actuator in a first position (FIG. 3A) and second position (FIG. 3B).
Figure 3B:
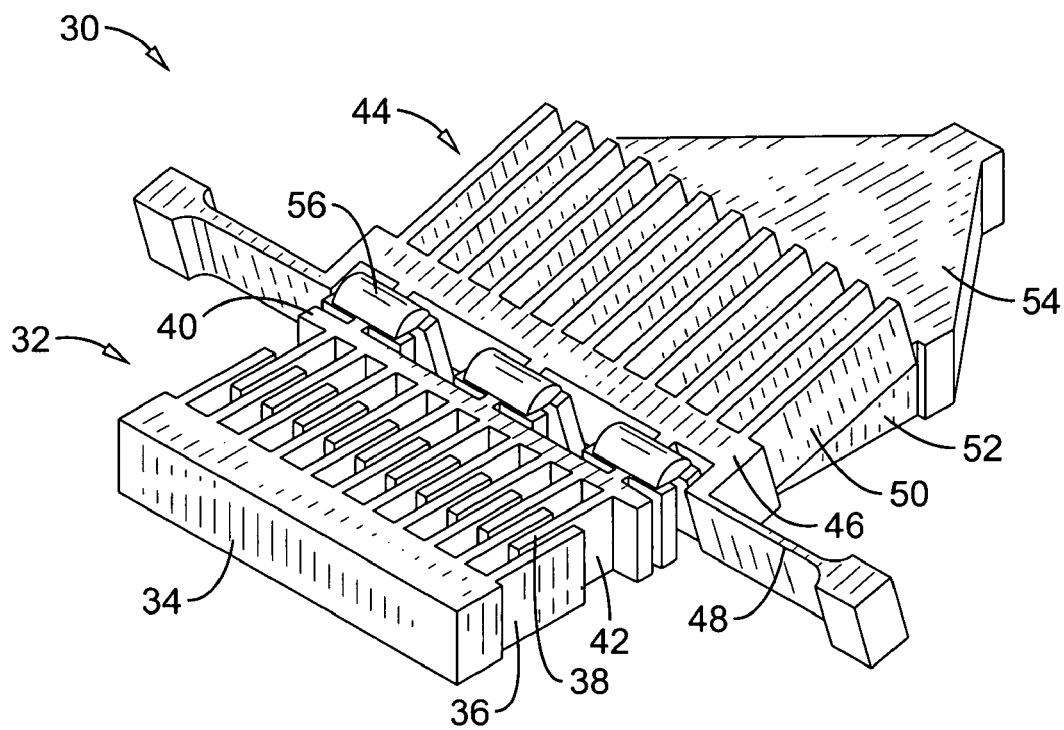

FIG. 3A and FIG. 3B illustrate an example embodiment 30 of an AVC tunable capacitor, shown mechanically biased to an initial position at maximum capacitance while at a zero electrical bias voltage in FIG. 3A, and fully actuated to provide a minimum capacitance in FIG. 3B. It will be appreciated that the device can be alternatively configured for mechanical biasing to a minimum capacitance state from which it is deflected under an electrical bias toward a maximum capacitance state.

This embodiment is shown comprising two sets of interdigitated comb fingers (36, 38 and 50, 52) which move in relation to one another for varying the capacitance. An actuator element 32 is formed by the shorter suspended DC comb fingers, comprising a stationary comb with base 34 and fingers 36 and a movable comb with fingers 38 and base 40. Base 40 of the movable comb is coupled to the base 46 of a movable capacitive (RF) comb having fingers 50 which are configured for interdigitation with fingers 52 coupled to base 54 of a stationary comb. The two sets of comb fingers are shown coupled through a distributed series of hinges 56, such as using a BCB material previously described. A mechanical biasing means is exemplified as a torsional element 48.

In one embodiment of the invention the DC comb filter is set at an initial angle, from which it is displaced in response to actuation. For example, by establishing an initial (non-biased) angularly raised position for the movable DC comb and then applying a voltage bias between the suspended and fixed fingers of the DC comb, the electric field pulls the suspended fingers towards the fixed fingers, which in turn, rotates the longer RF fingers (coupled to the DC comb) that are located at the opposite end of the device. The change in the overlapping area of the RF comb fingers due to the rotation tunes the total capacitance. It should be noted that the interdigitating fingers of the capacitive comb are shown displaced to minimize the gap between alternating plates, thereby increasing the maximum capacitance value.

For small initial tilt angles, the AVC actuator exhibits continuous rotation, however, when the initial tilt angle exceeds a critical angle, electrostatic pull-in between the tilted comb and the fixed comb becomes a factor. Careful consideration of device dimensions and geometry are taken into account to avoid the pull-in phenomenon. The conditions for which pull-in can occur as described by Eq. (1):

$$PI(\theta) = \frac{\partial C}{\partial \theta} - \theta \frac{\partial^2 C}{\partial \theta^2} \quad (1)$$

where C is the capacitance of the actuator combs and θ is the angle of rotation. Eq. (1) is derived from the equilibrium equation between the electrostatic and restoring mechanical torques. To avoid pull-in, Eq. (1) must be positive for all angles. The equation can be rewritten in terms of comb finger dimensions to determine the maximum finger lengths for actuator combs, as shown in Eq. (2):

$$l_{max} = \frac{3}{2} \frac{t_{finger}}{\theta_{initial}} - l_{offset} \quad (2)$$

where $l_{max}$ is the maximum allowed overlapped finger length of the DC comb without pull-in and $l_{offset}$ is the distance from the axis of rotation the tip of the stationary DC fingers. The device thickness is represented by $t_{finger}$. From Eq. (2) and the predetermined reflow angle $\theta_{initial}$, optimal dimensions for the tunable capacitor for maximum tuning range can be found. It should be pointed out since the RF comb fingers are not subject to the DC bias voltages they can be much longer than the DC fingers of the actuator, unlike in lateral motion comb drive devices in which the RF fingers needs to be shorter. The use of separate RF combs can provide increased capacitance and optimized tuning ratio. The primary limits imposed on the length of RF fingers is based on lateral bending and stiction of the fingertips.

Although not described in these experimental embodiments it is contemplated that the movable combs can be adapted by joining an insulating plate/layer across the backside of the combs to increase the rigidity of the fingers. The insulation does not effect the rotation of the combs, however, it adds complexity to the fabrication process.

FIG. 4A through FIG. 4F illustrate an embodiment of a fabrication process flow. In this embodiment, the AVC device is fabricated from a compound wafer 60 comprising an SOI substrate bonded upside-down to an insulating substrate 68, such as glass. The SOI substrate comprises bulk silicon 62, an insulation layer 64, and single-crystalline Si layer 66, which is a 10 μm layer in this embodiment or more preferably thicker, such as 25 μm, 50 μm, and so forth as described later. A thicker device layer increases the tunability range for the device.

A glass substrate 68 was chosen to reduce parasitic capacitance, for example, the use of borofloat glass (BSG) which provides matched thermal expansion coefficient with Si (3.25 ppm) and a fast etch rate in hydrofluoric (HF) acid that greatly facilitates the releasing step. Low resistive SOIs are used to minimize the series resistance. The silicon device layer 66 from a silicon-on-insulator (SOI) wafer is bonded face down to the BSG substrate 68, such as by anodic bonding. Prior to bonding, the SOI and the glass wafers are thoroughly cleaned and dehydrated to ensure an intimate hydrophilic surface between the wafers for complete contact to be created between the wafers. The Wafers are then anodically bonded at 400°C. and 700V resulting in FIG. 4A. Bonding times vary depending on applied voltage. Lower voltages require longer bonding time but produce a more effective bonding and fewer voids. The thermal expansion coefficient (TEC) of BSG is also well matched to that of Si below 400° C., which greatly reduces the stress on the silicon device layer.

Figure 4A:
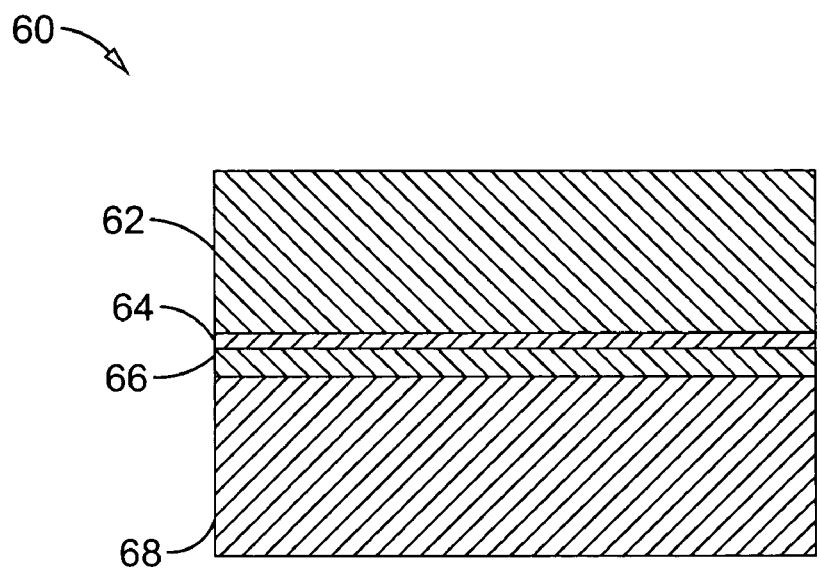
FIG. 4A–4F are cross-section views of angular vertical comb tunable capacitor fabrication according to an embodiment of the present invention.
Figure 4B:
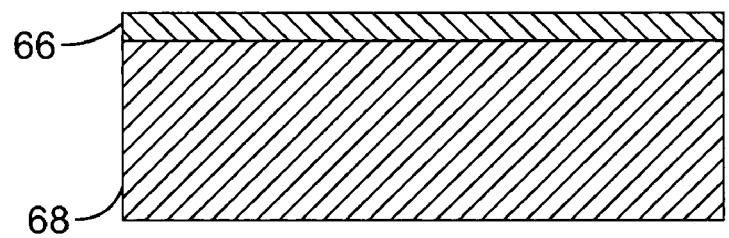

FIG. 4B illustrates the result after etching away unwanted layers. The SOI substrate 62 is removed, such as by a combination of mechanical and chemical etching. The exposed buried oxide layer 64 is also etched away, such as in a diluted solution of buffered hydrofluoric acid (BOE). It should be appreciated that this intermediary material having a device layer, such as silicon, of a desired thickness over a base material, such as borosilicate glass, can be formed in a number of alternative ways, such as by additive and/or subtractive processes without departing from the teachings herein.

Figure 4C:
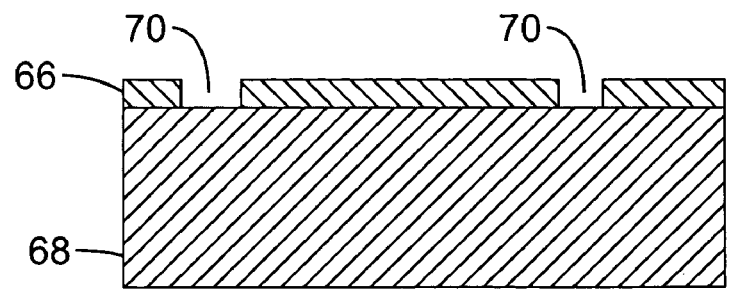

FIG. 4C depicts the material after the 10 μm silicon film is patterned and etched, such as by using deep reactive ion etching (DRIE) to form the device structure with etched away areas 70.

Figure 4D:
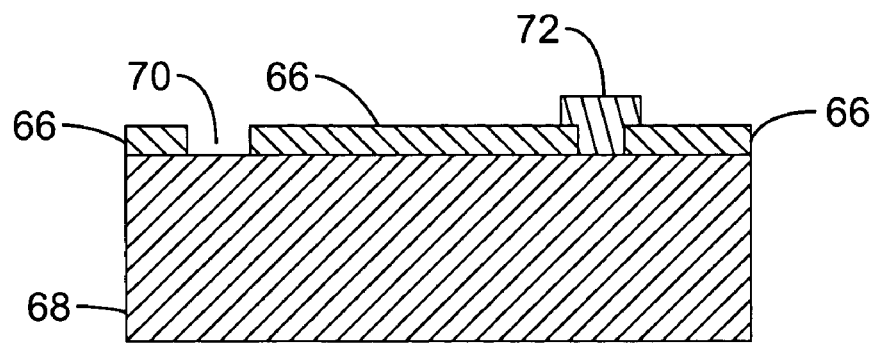

FIG. 4D illustrates the formation of hinges 72 between the movable and stationary sections of the device. For example, in this embodiment the hinges are formed from photosensitive BCB (Cyclotene) which is patterned to physically connect the base of the movable RF comb and the base of the movable DC comb.

Figure 4E:
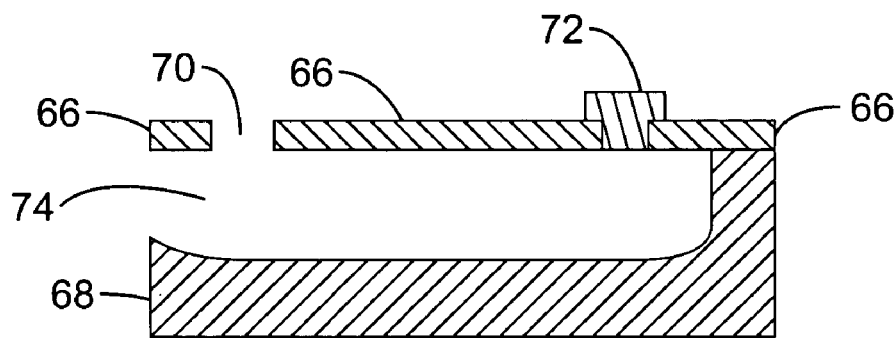

FIG. 4E is shown after a release step to free the movable comb element 76 etched from silicon device layer 66. In this step the hinges are preferably cured at 300° C. to increase robustness for subsequent etching. A portion of the glass substrate is then etched away, such as in 49% hydrofluoric acid solution for ten minutes at an etch rate of 7 μm /min, or sufficient etching to release the suspended fingers.

Figure 4F:
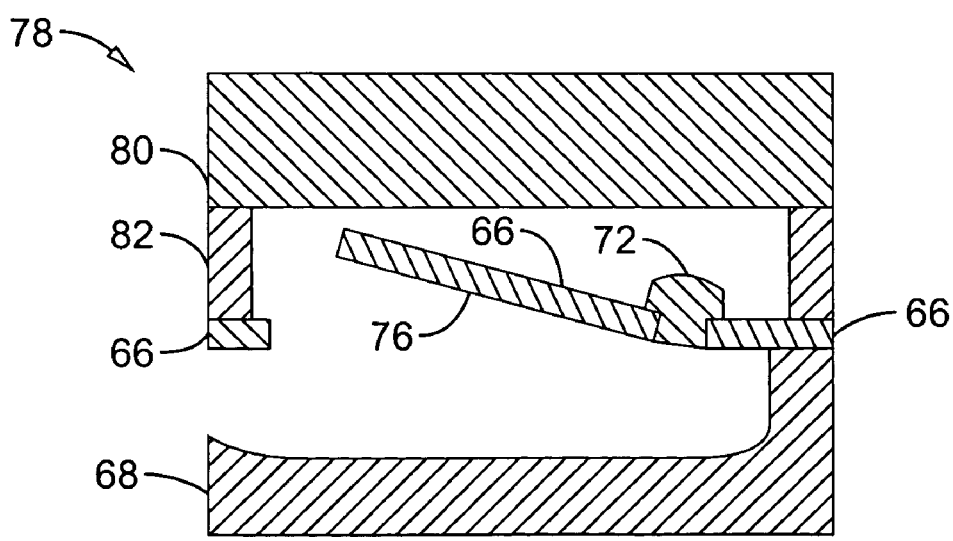

In FIG. 4F the movable DC comb fingers 76 are assembled to an initial angle above the substrate plane. In one embodiment of this process a cover-lid substrate 78, having planar lid 80 and spacers 82 of a desired length, is retained over the device area to establish $\theta_{initial}$, for electrode fingers 76. Supercritical drying is preferably performed to minimize release stiction, particularly between the long comb fingers. The hinges are then recured at 400° C. in a nitrogen overpressured oven for about twenty minutes. The DC comb fingers are assembled to the initial angle $\theta_{initial}$, (i.e. 20 degrees) in response to the surface tension of the reflowed hinges and constrained by lid 80. The initial angle can be established at any desired angle depending on the design of the particular tuning capacitor, preferred ranges are between ten to thirty degrees, with twenty degrees being most preferred for this embodiment.

Mechanical limiters can be additionally or alternatively utilized for establishing the angle of the comb fingers. A mechanical limiter incorporated in one embodiment extended from the base of the comb and caught a stationary section of the device layer at a given angle. Various forms of mechanical limiters can be utilized.

However, it was found that the cover-lid provided increased uniformity of initial angle in comparison with the use of a limiter. This can be understood as follows. The etching process, which patterns the device including the springs, comb fingers, and limiters, can be nonuniform from device to device and chip to chip. Thus the physical dimensions of the limiters can change between wafers and even between devices on the same wafer leading to different initial reflow angles. This nonuniformity is a result of undercutting and footing, side-effects which are difficult to control. Cover-lid 78 removes this uncertainty by not relying on the etching process. Instead, the cap creates a physical barrier above the device which the comb fingers will hit at a specific angle. From our preliminary results, the cap provides more reproducible reflow angles. Inclusion of a limiter, can provide a backup form of limiting should the cap not be secured properly, or in cases where the tighter angular tolerances are not necessary.

The final process step (not shown) involves the metallization over the entire sample, for example with approximately 2500 Å, or more, of sputtered aluminum for better conductivity. Sputtered aluminum provides better step coverage particularly at the sidewalls of the comb fingers. It will be appreciated that the metallization may be performed to any desired depth by any convenient means.

A similar assembly process had been performed using conventional photoresist, however, the use of BCB is more preferable due to its chemical and thermal stability. Unlike conventional photoresist, even uncured BCB can withstand prolonged exposure to HF and solvents without evidence of delaminating or degradation.

It was found that the initial design for the MEMS tunable capacitor exhibited a tuning ratio of 1.67:1. While this value exceeded the theoretical limit of 1.5:1 for parallel plate capacitors, we felt the performance was far from satisfactory. After detailed examination, it was found that the smaller than expected tuning ratio was primarily a result of suspended comb fingers sagging along the length of the device. The sagging resulted in a finite overlap of the RF comb fingers at maximum rotation. Therefore, a second generation device design was created and tested.

Figure 5:
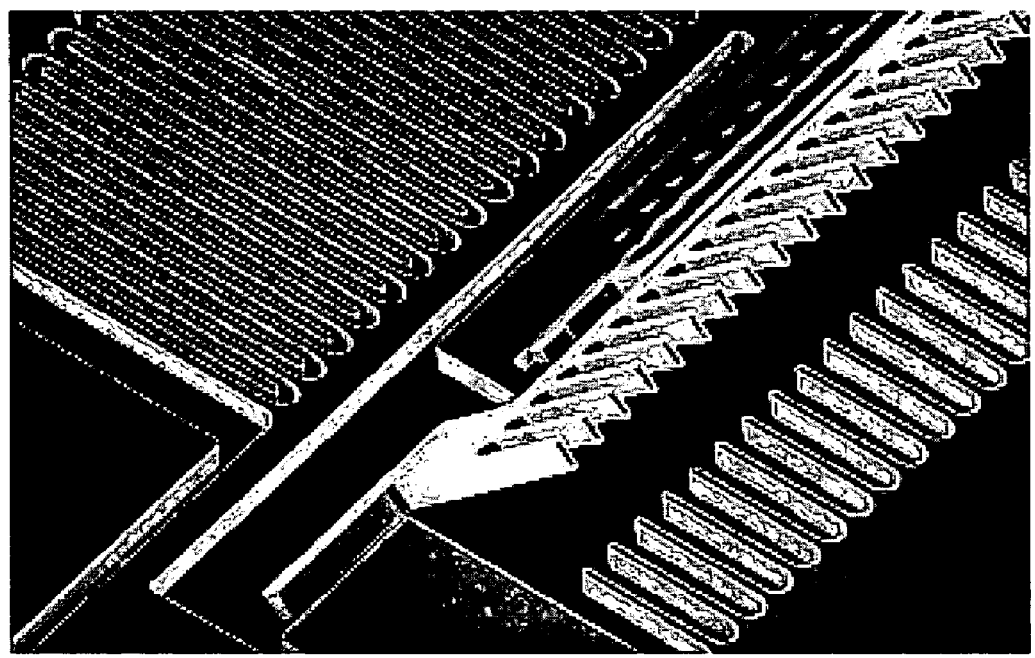
FIG. 5 is an SEM micrograph image of an AVC tunable capacitor according to an aspect of the present invention, showing a close-up of a first end of the actuator combs at a predetermined angle above the device plane.
Figure 6:
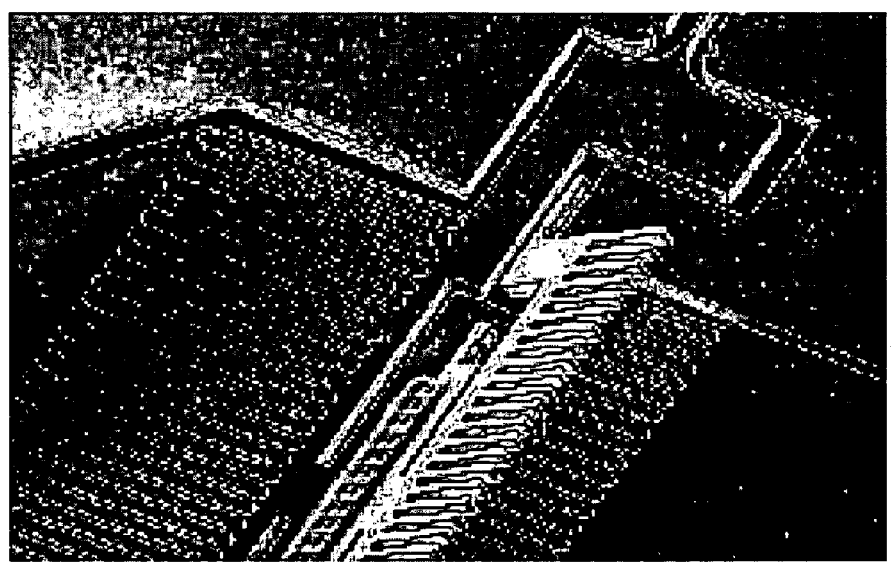
FIG. 6 is an SEM micrograph image of the AVC tunable capacitor of FIG. 5, showing a second end of the actuator combs.

FIG. 5 and FIG. 6 illustrate second generation devices depicted as micrographs of actual working AVC tunable MEMS capacitor devices with the driving electrode fingers at their initial angle. The AVC tuning capacitor device of these figures was fabricated with a 10 μm device layer. In relation to the first generation device, the length of the torsion spring was reduced while its width was increased. Since the bending spring constant is inversely proportional to the cube of the length, this greatly reduces the sagging with slight increase of actuation voltage. The DC movable fingers now align with the fixed fingers without any evidence of sagging. The change resulted in a 262% increase in the tuning ratio to a value of 4.2:1. FIG. 5 is a magnified view of a first end of the combs, while FIG. 6 depicts the opposing end of the combs.

This AVC tuning capacitor device was characterized with regard to capacitance and S parameters with a network analyzer and a high frequency coplanar waveguide probe with ground-signal-ground configuration. The measurements were calibrated for two-port measurements.

Figure 7:
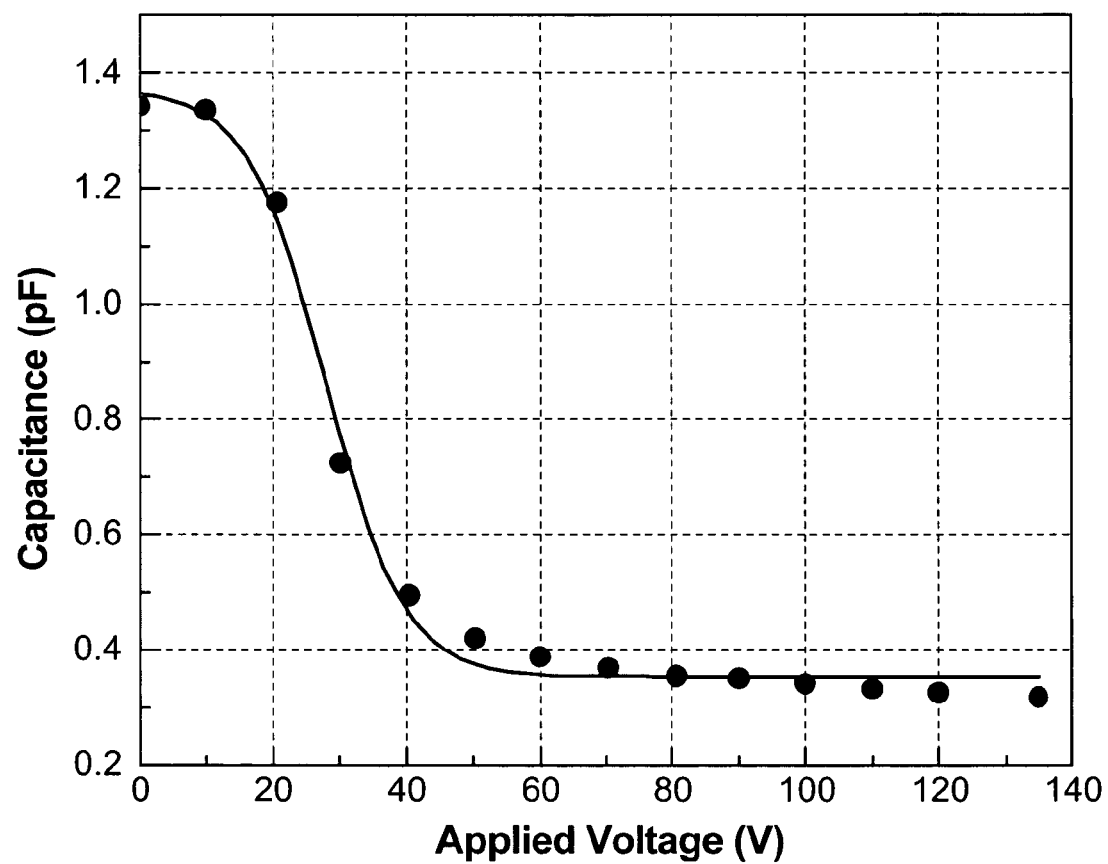
FIG. 7 is a plot of capacitance as a function of actuation bias voltage for an embodiment of the AVC tunable capacitor, showing a comparison between analytic estimation and experimental results.

FIG. 7 depicts capacitance in response to applied voltage (CV). The maximum capacitance arose at zero bias and was measured at 1.34 pF. At maximum applied voltage, the capacitance was reduced to 0.32 pF. The theoretical curve is shown by the line while the dots represent data points measured during experimentation. As seen from the figure, a high degree of correlation is exhibited between the theoretical and experimental results. As expected, the device did not show signs of pull-in. The capacitance value for the device reduces continuously as the voltage increases to 60 V. Beyond 60 V, the capacitance saturates and decreases very slowly.

Figure 8:
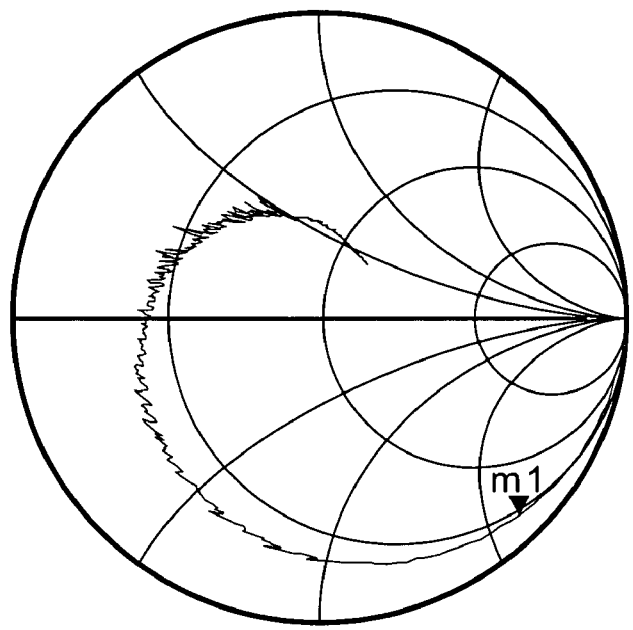
FIG. 8 is a Smith chart of maximum capacitance across a range of frequencies for an AVC tunable capacitor according to an embodiment of the present invention.
Figure 9:
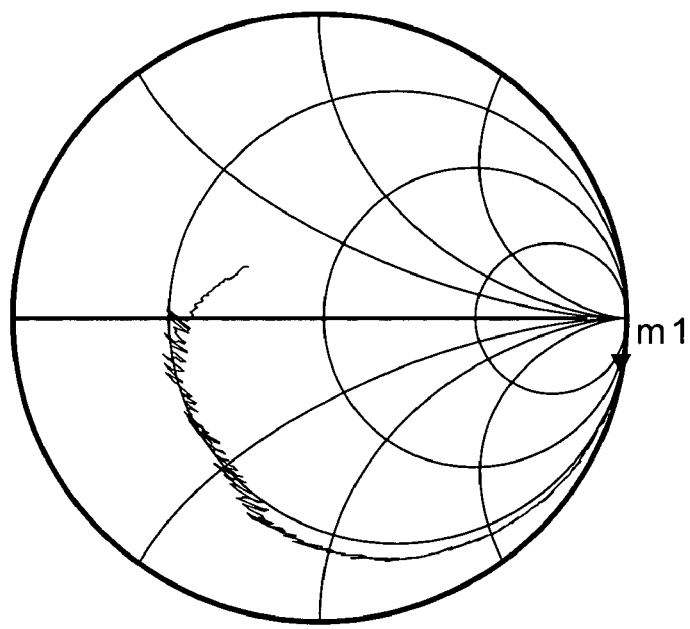
FIG. 9 is a Smith chart of minimum capacitance across the same range of frequencies as depicted in FIG. 8.

FIG. 8 and FIG. 9 illustrate the S11 parameters over a range of frequencies. FIG. 8 represents $C_{max}$ while FIG. 9 represents $C_{min}$ over the frequency range. The quality factor Q is measured by extrapolating the impedance values with respect to frequency from the network analyzer. The quality factor, Q, is measured to be 71 and 8.7 at 1 GHz for minimum and maximum capacitances, respectively.

Figure 10:
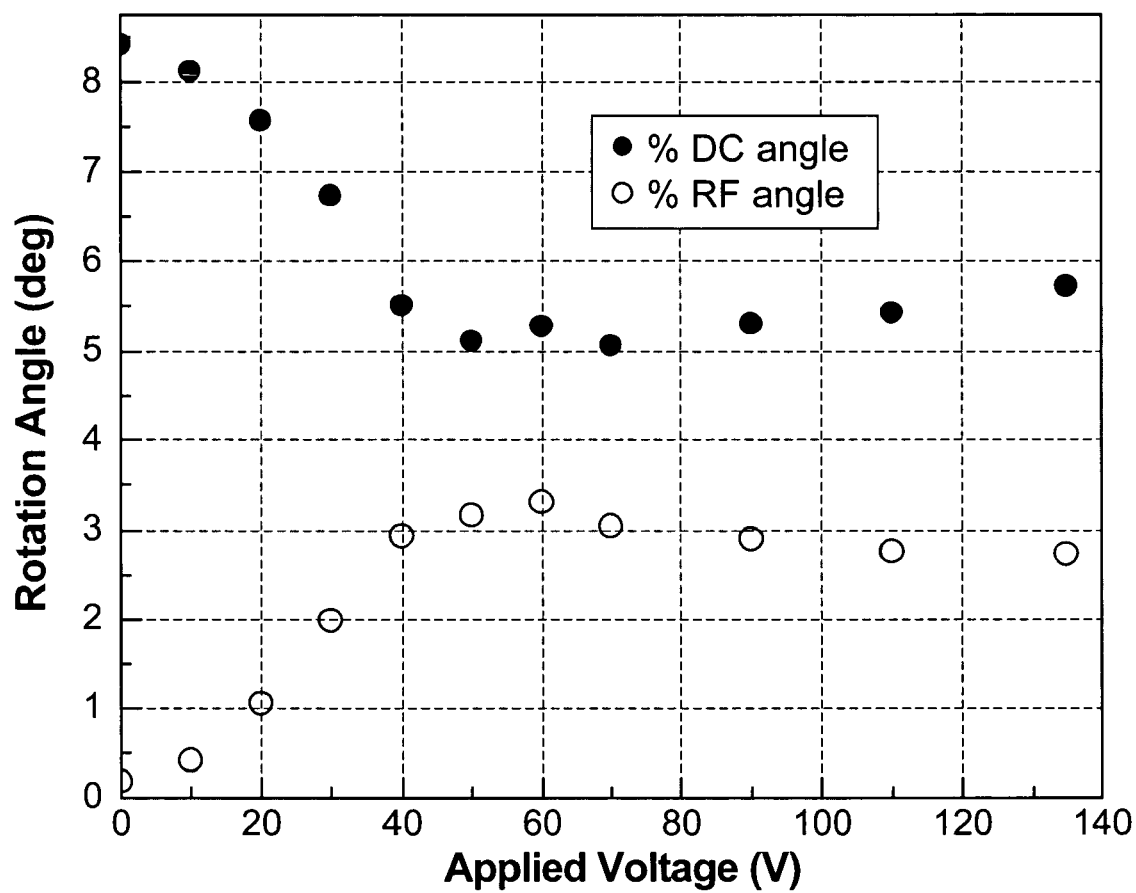
FIG. 10 is a plot of comb rotation angle for an AVC tunable capacitor according to an embodiment of the present invention in response to applied voltage, showing the rotation of both the actuator and the tuning comb.

FIG. 10 shows the transfer curve which corresponds to the above C-V measurement, wherein the measured angles of both the DC and RF comb fingers are represented. The suspended DC fingers have an initial reflow angle of 8 degrees (8°). Maximum rotation of 3 degrees (3°) occurs at 60 V. In principle, full rotation of eight degrees (8°) should be reached at sufficiently high voltage for AVC actuators. A close examination of device operation under a microscope for this particular implementation revealed that the rotating structure had hit an intruding beam at three degrees (3°), thus preventing the fingers from further rotation. This impediment was removed in later generation devices to reach larger rotation angles.

Theoretical modeling was performed on the AVC tunable capacitor to investigate various parameter ranges for optimizing its performance. It was found that a very effective means of increasing the tuning ratio was to increase the device layer thickness. Migration towards thicker silicon film supports larger tuning ratios as maximum capacitance between the comb fingers is increased compared to the fringe capacitance which is exhibited when the comb fingers are separated.

Figure 11:
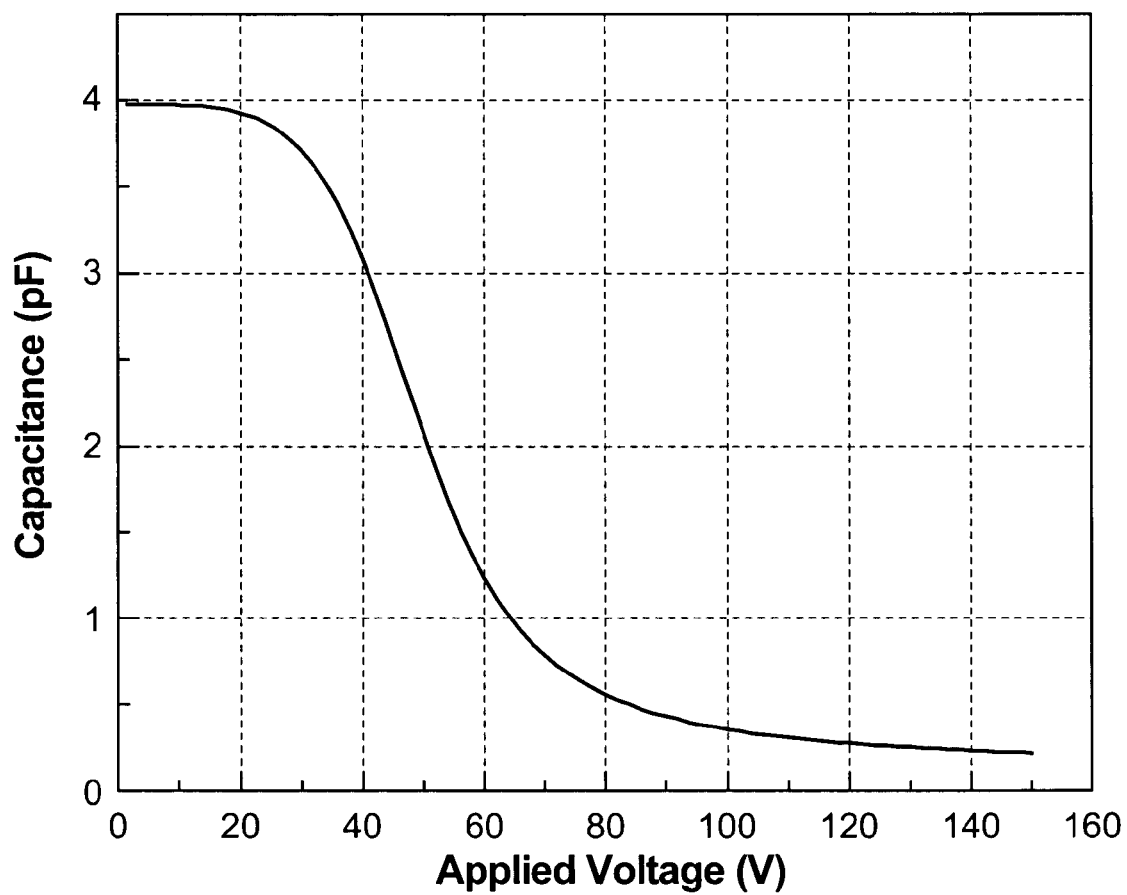
FIG. 11 is a plot of a theoretical capacitance-voltage curve for a 25 μm thick AVC tunable capacitor according to an embodiment of the present invention.

FIG. 11 depicts a theoretical curve of maximum tuning ratio for a 25 μm thick device with 10 degree initial tilt angle. It was determined from this that a tuning ratio of at least 15:1 should be achievable for a given finger length. This theory was confirmed, as described later when a tuning ratio or 20:1 was achieved. As with the tuning ratio, the quality factor can be improved with the use of highly resistive SOI wafers to reduce resistive loss from the silicon device layers.

FIG. 12A through FIG. 12F embody steps for fabricating an AVC tunable capacitor having a separate actuator shown comprising a second set of comb elements.

Figure 12A:
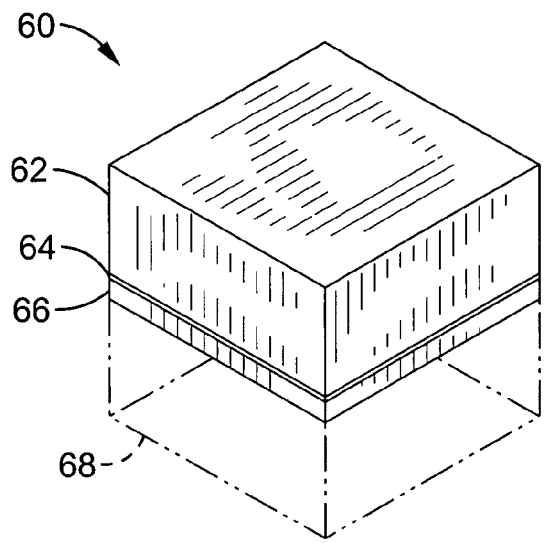
FIG. 12A–12F are perspective views of steps in the fabrication process for angular vertical comb tunable capacitors according to an embodiment of the present invention, showing fabrication of an AVC tunable capacitor utilizing a separate actuator.
Figure 12B:
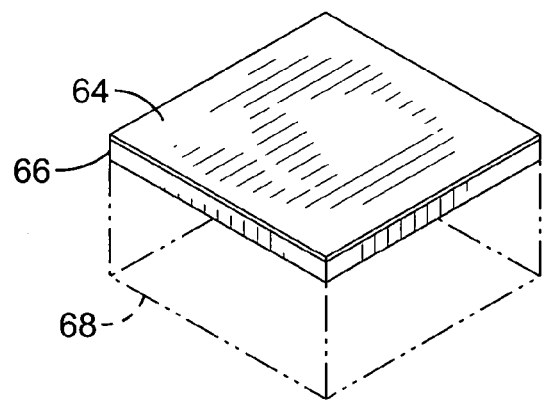
Figure 12C:
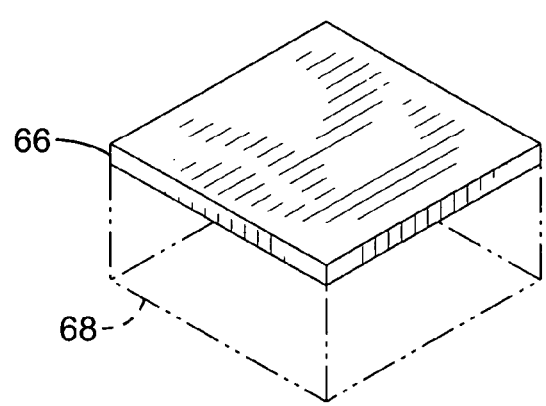
Figure 12D:
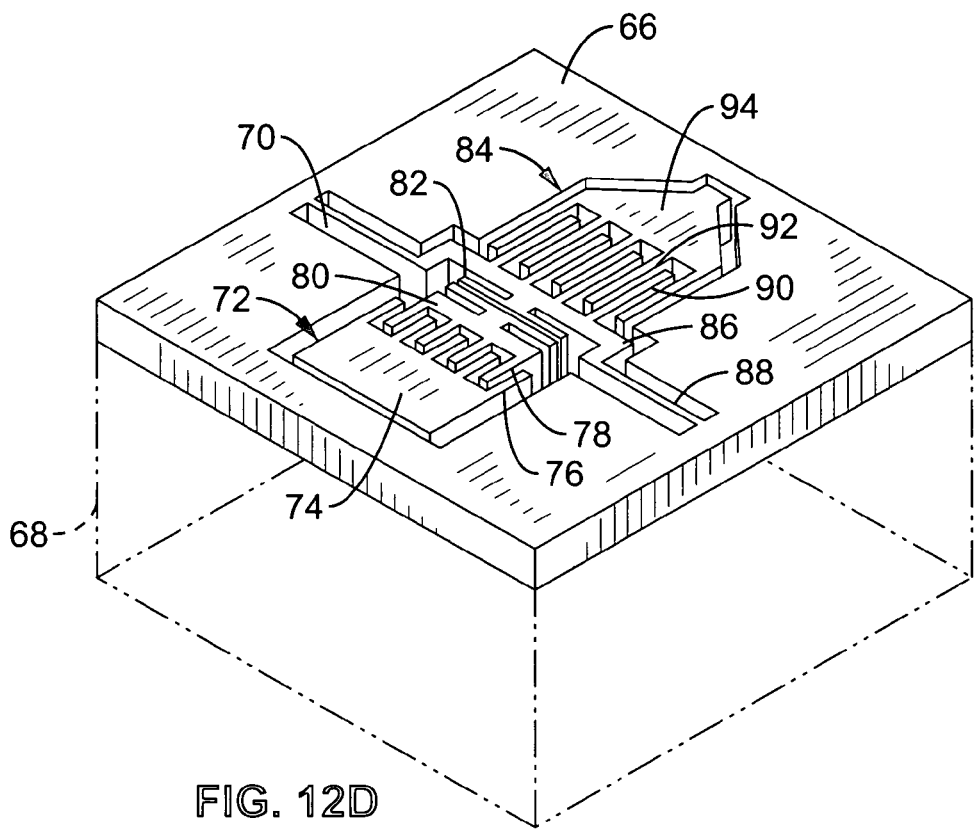
Figure 12E:
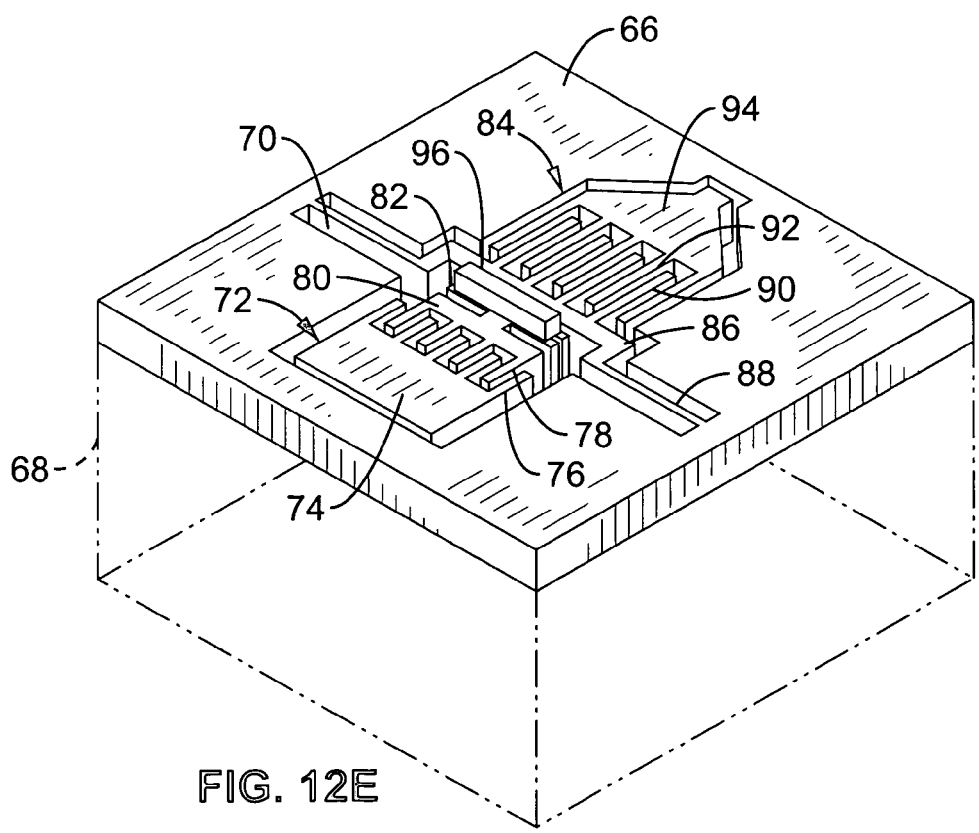
Figure 12F:
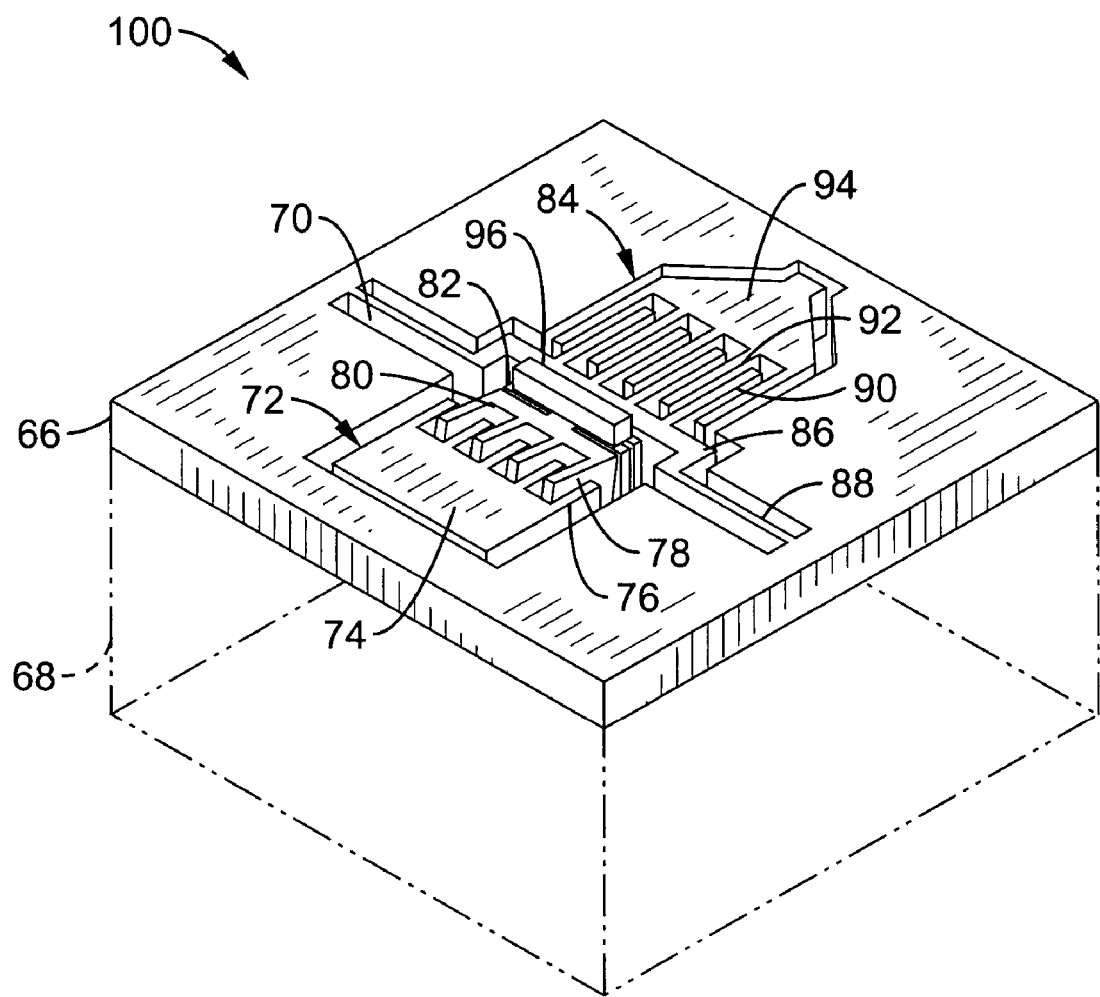

FIG. 12A depicts a section of a blank substrate 60 after bonding an SOI wafer comprising a silicon substrate 62, buried insulation layer 64, and single-crystalline silicon layer 66 (i.e. 25 μm thick Si), to an insulating wafer, such as glass. In FIG. 12B and 12C the silicon substrate 62 and buried oxide layer 64 of the SOI are removed to expose the 25 μm thick single crystal silicon layer 66 shown in FIG. 12C. The 25μm thick single crystal silicon layer 66 comprises the device layer for fabricating the AVC tunable MEMS capacitor. FIG. 12D illustrates the wafer after a single-step DRIE etch is employed to remove material 70 and define patterns. An actuator section 72 has a stationary base 74 with electrode fingers 76 and movable electrode fingers 78 on movable base 80. An RF section has a movable base 82 coupled through torsional biasing strip 88 to the remainder of layer 66. Extending from movable base 82 are electrode fingers 90 that can be interposed between the stationary electrode fingers 92 coupled to base 94. In FIG. 12E, the suspended actuator and capacitor combs are connected via compliant hinge 96. In this embodiment the hinges preferably comprise photosensitive BCB polymer hinges which are cured, such as at 400° C., after the device is released in hydrofluoric (HF) acid as shown in FIG. 12F. Metallization with sputtered aluminum finally completes the fabrication of device 100.

The finished device 100 depicted in FIG. 12F is shown in a released state in which the driving comb fingers (electrode fingers) are oriented at an angle above the substrate plane at an initial angle and the sensing electrodes are parallel with the ground plane. Tuning of the capacitance can easily be accomplished by applying a bias voltage between the rotated fingers and the fixed fingers of actuator 74. The electrostatic field generated by this bias voltage pulls the elevated actuator comb finger downward, toward full interdigitation, thereby rotating the coupled sensing finger electrodes located at the opposite end above the substrate in an upward direction, away from full interdigitation. It is this rotation of the sensing fingers that tunes the capacitance value.

The fabrication process uses BCB material in creating the hinge in a novel assembly mechanism. Although photoresist can be very effective for assembling 3D structures by reflow, the use of BCB polymers which cure at higher temperatures provides a more robust and chemically resistant structure. The AVC tunable capacitor is self-assembled during this BCB cure. However, BCB does not reflow under the standard curing process and we have found that reflow requires soaking in HF prior to curing.

Figure 13:
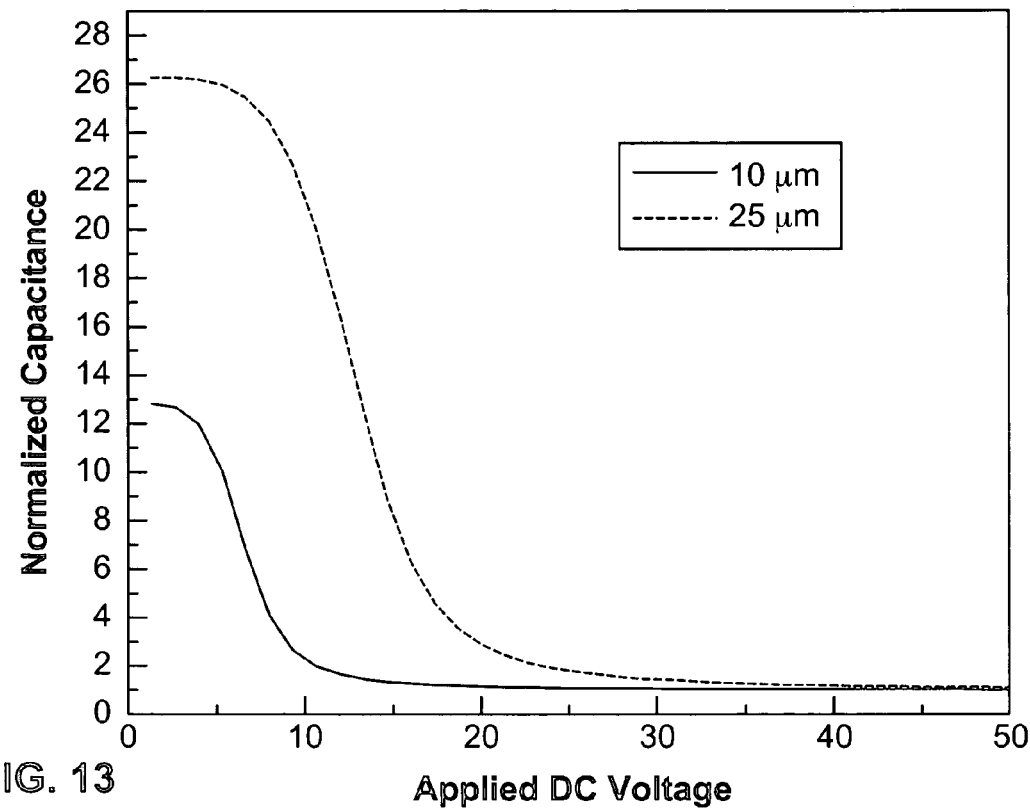
FIG. 13 is a plot of capacitance (theoretical) as a function of applied DC bias voltage for two different thicknesses of AVC tuning capacitor fabricated according to an embodiment of the present invention.

FIG. 13 depicts the normalized capacitance versus voltage (C-V) characteristics for a 10 μm and 25 μm thick tunable capacitor. The thickness of the tunable capacitor refers to the thickness of the layer from which the fingers of the combs are formed for the tunable capacitor.

Figure 14:
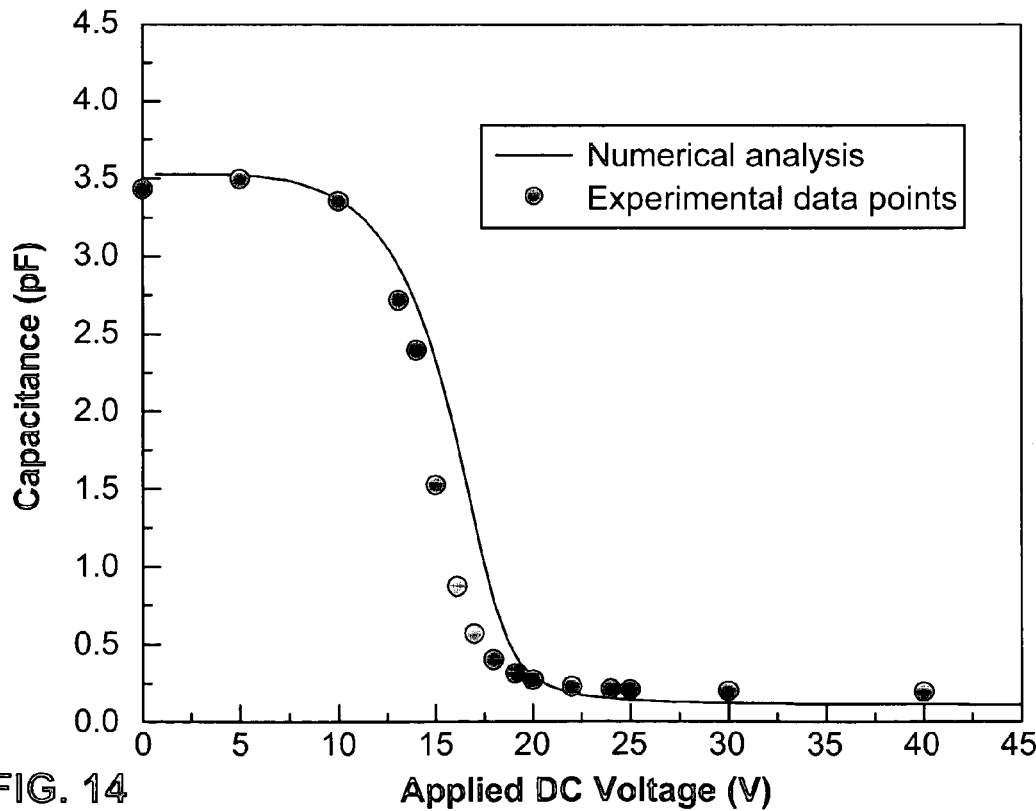
FIG. 14 is a plot of capacitance as a function of applied DC bias voltage for an AVC tuning capacitor according to an embodiment of the present invention, showing the comparison between the numerical analysis and the experimental results.

FIG. 14 depicts a plot of capacitance in response to applied voltage showing a numerical plot compared with empirical data points recorded during experimentation. It can be seen that an excellent agreement exists between experimental data (dots) and theoretical calculation (solid line). Maximum and minimum capacitances for this embodiment of the device are 3.4 pF and 0.2 pF, giving a total tuning ratio of 17.8 to 1.

Figure 15:
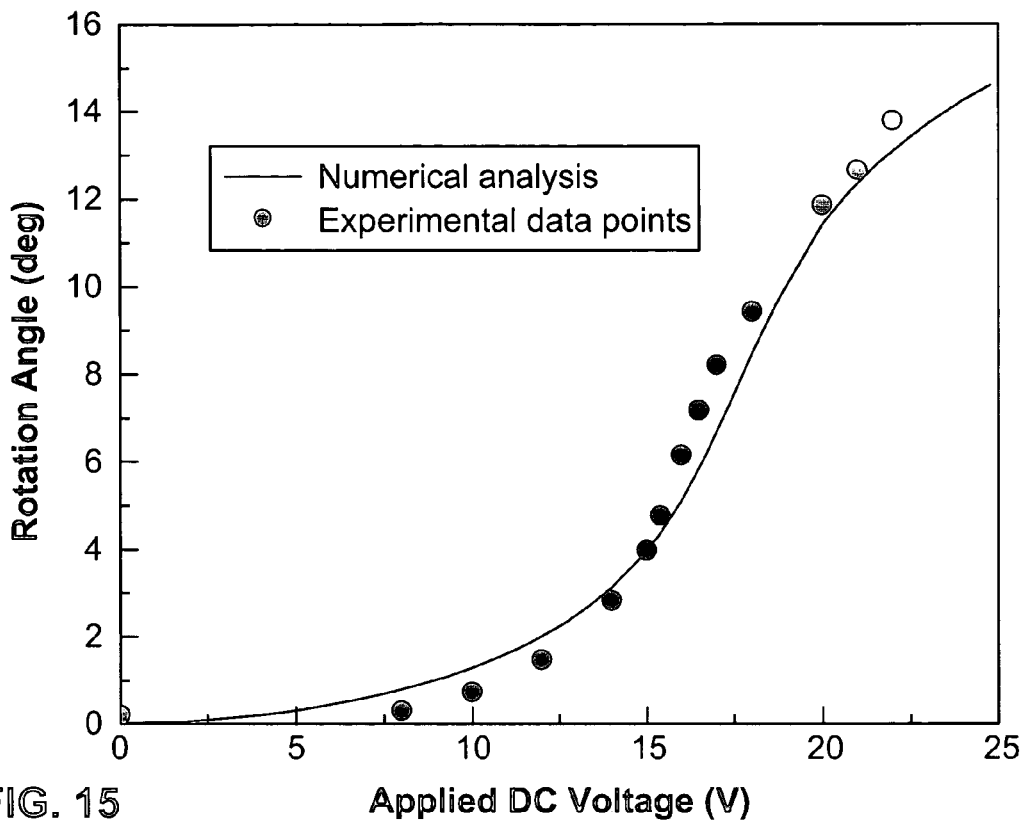
FIG. 15 is a plot of rotation angle as a function of applied DC bias voltage for an AVC tuning capacitor according to an embodiment of the present invention, showing the comparison between the numerical analysis and the experimental results.

FIG. 15 depicts a corresponding transfer curve for the sensing fingers of the device used in FIG. 13 and FIG. 14. It can be seen that measured rotation angle for this embodiment is greater than 14 degrees with an operating voltage of 22 V.

Figure 16:
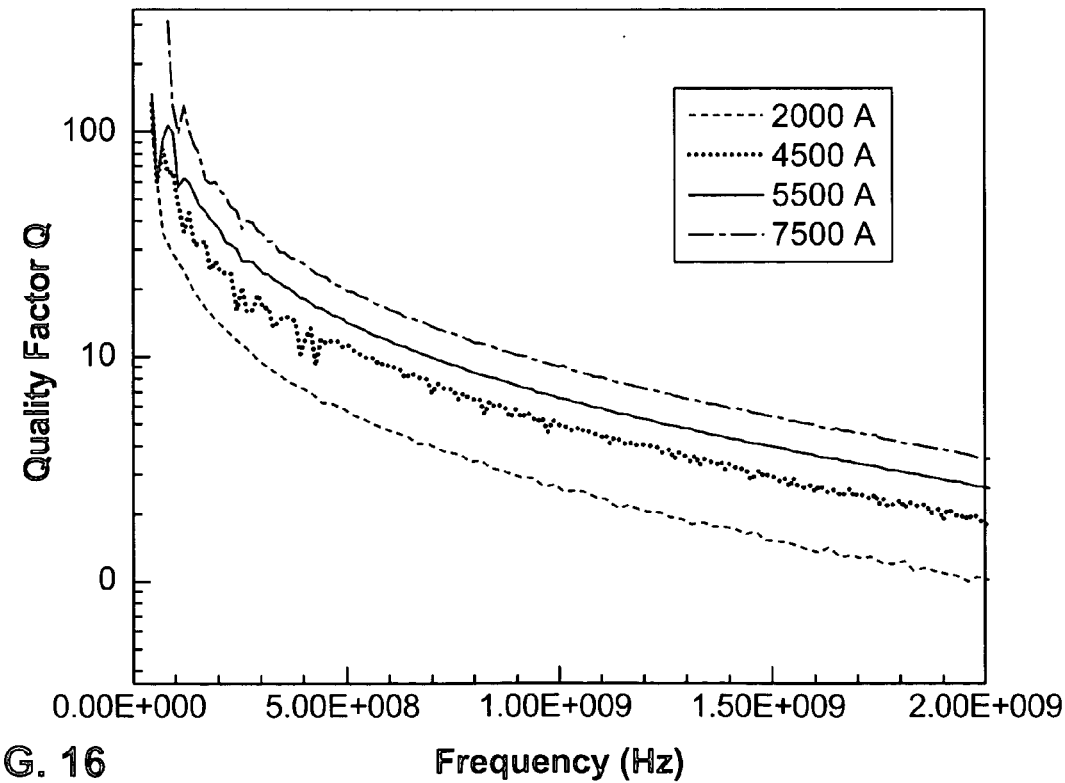
FIG. 16 is a plot of quality factor as a function of operating frequency for an AVC tuning capacitor according to an embodiment of the present invention, showing a comparison between different metal thickness values.
Figure 17:
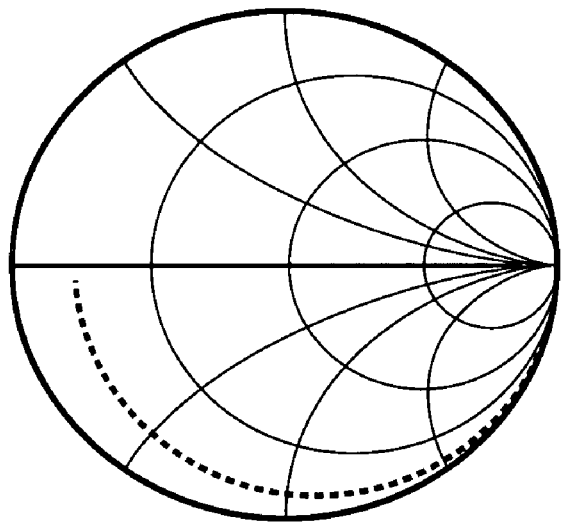
FIG. 17 is a Smith chart of $C_{MAX}$ over a range of frequencies for an AVC tuning capacitor according to an embodiment of the present invention.
Figure 18:
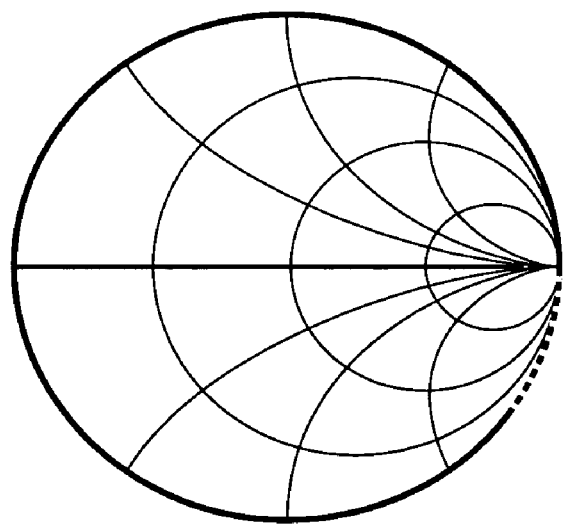
FIG. 18 is a Smith chart of $C_{MIN}$ over a range of frequencies for an AVC tuning capacitor according to an embodiment of the present invention.

FIG. 16 through FIG. 18 illustrate quality factor and S parameters which were extrapolated from the network analyzer. In FIG. 16 it is seen how device Q is increased, thus lowering losses, by increasing the metal thickness from 2000 Å through to 7500 Å. For example, the increase in metal thickness reduces the loss by increasing the electrical Q of the device to 55 at 200 MHz. FIG. 17 and FIG. 18 are Smith charts of the S parameter for $C_{MAX}$ in FIG. 17, and $C_{MIN}$ in FIG. 18, across the range of frequencies from 45.00 MHz through 5.000 GHz.

A comprehensive model of the AVC tunable capacitor has been developed. The equilibrium position of the AVC comb fingers is reached when the electrostatic torque is balanced by the restoring torque of the torsion beams. Equation (3) and (4) shows the expressions for the respective torques.

$$T_e(\theta) = \frac{V^2}{2}\frac{\partial C}{\partial \theta} = N_{th}V^2\frac{\partial C_{unit}}{\partial \theta} \quad (3)$$

$$T_r(\theta) = k_s\theta \quad (4)$$

The variable $C_{unit}$ represents the capacitance between one set of comb fingers. Value $N_{th}$ is the total number of comb fingers, V is the applied voltage, $k_s$ is the spring constant of the torsion beams and θ the rotation angle of the electrode comb of the AVC capacitor. For a given applied voltage, there exist a rotation angle such that equilibrium is reached. This occurs when the torques are equal.

$$T_e(\theta) = T_r(\theta) \quad (5)$$

Pull-in can occur when the initial angle of the AVC capacitor fingers is larger than a certain threshold value. Thus, for continuous tuning it is important to stay below this threshold angle. The pull-in condition requires that the derivatives of torques must also be equal:

$$\left.\frac{\partial T_e}{\partial \theta}\right|_{\theta=\theta_{pi}} = \left.\frac{\partial T_r}{\partial \theta}\right|_{\theta=\theta_{pi}} \quad (6)$$

We combine Eqs. (5) and (6) to derive the conditions for pull-in:

$$PI(\theta) = \frac{\partial C}{\partial \theta} - \theta\frac{\partial^2 C}{\partial \theta^2} \quad (7)$$

To avoid pull-in, Eq. (7) must be greater than zero for all angles. The equation can be rewritten in terms of comb finger dimensions to determine the maximum allowed initial angle by replacing the capacitance C with the general expression for parallel plate capacitance.

$$C_{unit} = \frac{\varepsilon_0 A(\theta)}{d} \quad (8)$$

Combining Eq. (8) with Eq. (3), and expressing the area in terms of the finger dimensions, the limits are obtained for the initial tilt angle.

$$\theta_{initial} \leq \frac{3}{2}\frac{t_{finger}}{l_{ov} + l_{offset}} \quad (9)$$

where $I_{ov}$ is the overlapping finger length of driving comb fingers and $I_{offset}$ is the distance from the axis of rotation to the tip of the fixed comb fingers. The device thickness is represented by $t_{finger}$. Given the appropriate finger dimensions we can determine the maximum initial angle without the risk of pull-in.

Analytical calculations can provide good approximations of the transfer curve and capacitance values. However, these calculations do not take into account the effects from fringe fields. For a more accurate model, we use numerical analysis to calculate the capacitance for Eq. (3).

Instead of a full three-dimensional finite element analysis, a two-dimensional analysis is utilized to determine the unit capacitance at various offsets between two fingers. One comb finger is considered to be positioned at a rotation angle θ with respect to the fixed finger. Our program calculates the capacitance per unit length for each offset position. This calculation assumes a finger thickness and a gap spacing of 25 μm and 2.85 μm, respectively.

Figure 19:
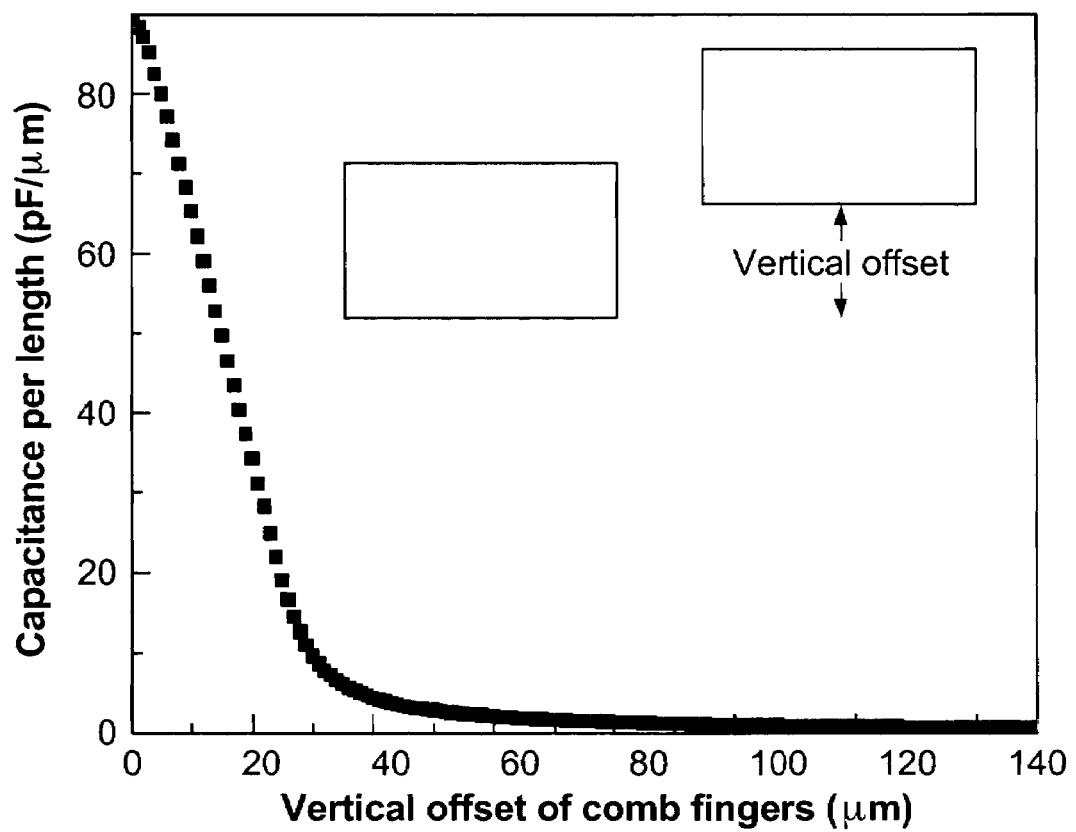
FIG. 19 is a plot of calculated capacitance per unit length values for an AVC tunable capacitor fabricated according to the invention, shown with an inset depicting the vertical offset of a movable finger within the movable comb which is displaced from the plane of a stationary finger of the stationary comb.

FIG. 19 illustrates calculated capacitance per unit length as a function of the vertical offset. Note that the capacitance does not reduce to zero when the fingers are completely separated due to the contributions from fringe fields. The curve in FIG. 19 can be closely approximated by a Gaussian function using least square fit. The pull-in condition can then be solved analytically using the fitted Gaussian function. Compared with the full three dimensional analysis, the hybrid analytical/two dimensional analysis has much shorter computation time and can be used iteratively for device design and optimization.

Figure 20:
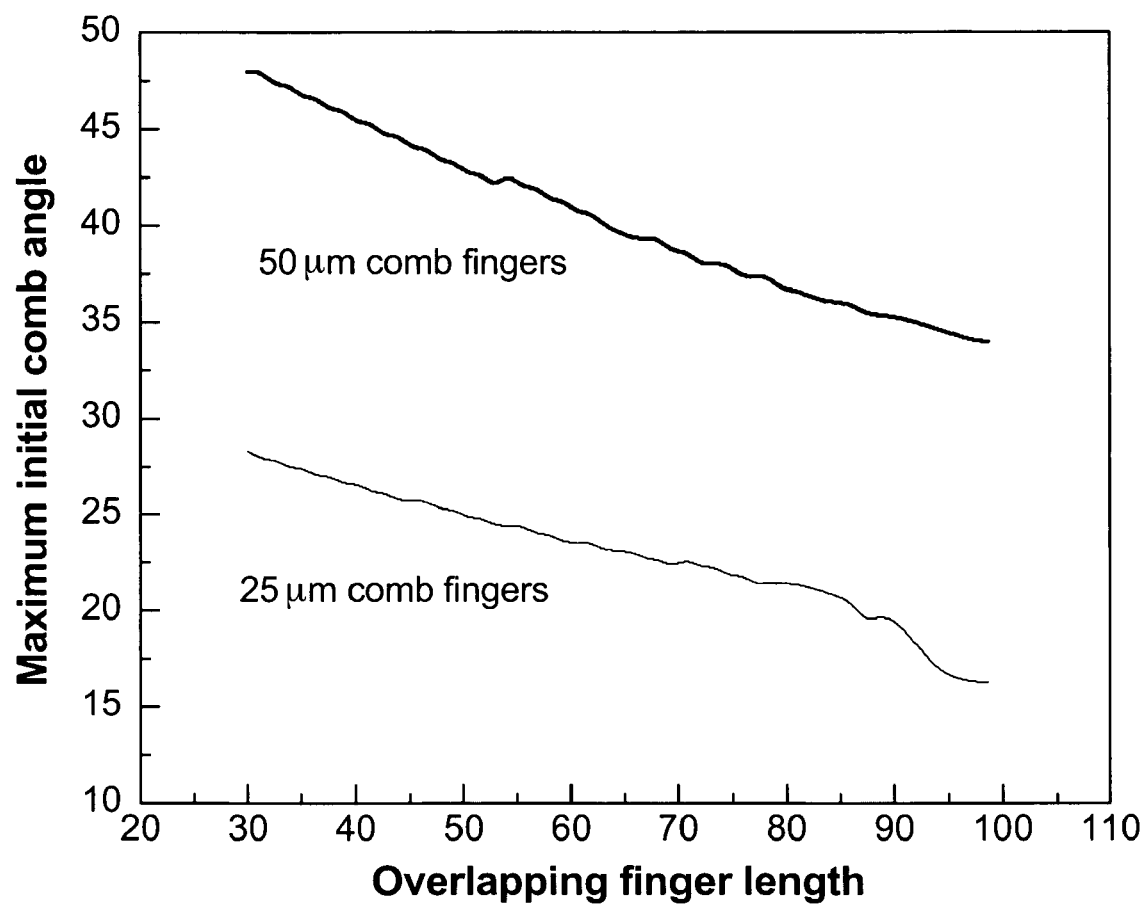
FIG. 20 is a plot of maximum allowable initial comb angle versus overlapping finger length for two different thicknesses of comb device fabricated according to an embodiment of the present invention.

FIG. 20 depicts the calculated maximum initial angle as a function of actuating comb finger length for two different comb finger thicknesses: 25 μm and 50 μm. The maximum value of the initial tilt angle of the actuating comb without pull-in was obtained by solving Eq. (9). The figure shows that migration to thicker comb fingers (50 μm) allows for larger initial AVC angles for the same comb finger length. Migration towards thicker fingers not only allows for larger rotation angles, which reduces the minimum capacitance, but also increases the maximum capacitance through a larger overlapping area.

Figure 21:
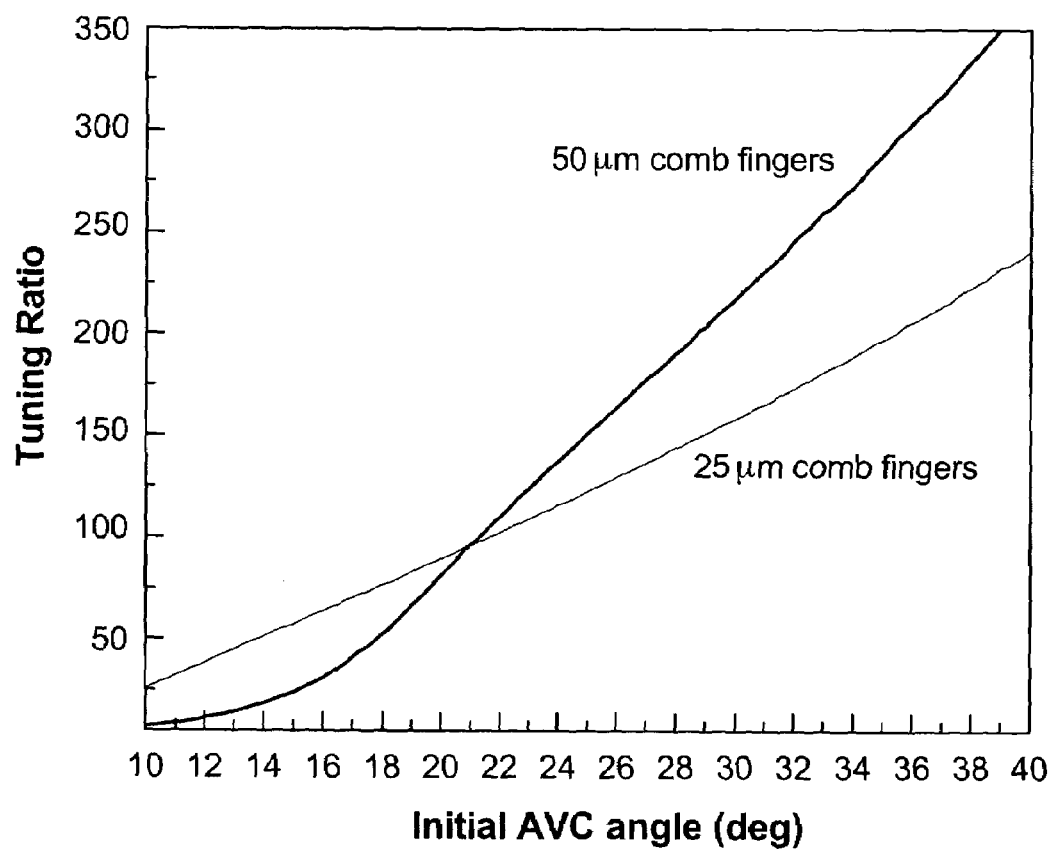
FIG. 21 is a plot of tuning ratio as a function of initial AVC angle for two different thicknesses of comb device fabricated according to an embodiment of the present invention.

FIG. 21 shows the calculated tuning ratio for devices with 25 μm and 50 μm thick fingers. Both curves are based on sensing comb finger length of 350 μm. For small initial AVC angles, the thinner device has larger tuning ratio because the sensing fingers are completely separated in the minimum capacitance state.

For large AVC angles, the 50 μm thick device exhibits a larger tuning ratio than the thinner devices. The actuation voltage also reduces with increasing finger thickness and lengths. It should be noted that the calculation here does not include the stray capacitance which limits the minimum capacitance and therefore the maximum tuning ratio attainable in practical devices.

Work has continued on the AVC tunable capacitors and the latest implementations of the device have electrode fingers which are 425 μm long and an initial comb angle of 20° which provided tunability from 0.27 to 8.6 pF, a continuous tuning range of 31:1. To our knowledge this is the highest tunability range reported. The maximum quality factor Q at 0.3 pF is 237 at 1 GHz.

Fabrication of this newer device generally follows the AVC capacitor fabrication process depicted in the sequence of FIG. 4A through FIG. 4F as already described. In this embodiment the Si layer is 25 μm thick. The photosensitive Cyclotene resist (BCB) hinges are patterned to physically connect the suspended sensing and floating driving fingers (refer to FIG. 4D). The BCB hinges are vertically offset then cured at 300° C. to increase robustness for subsequent etching processes. Supercritical drying is essential to minimize release stiction, particularly between the long comb fingers. After supercritical drying, the hinges were re-cured at 400° C. in a nitrogen-overpressured oven for twenty minutes. The movable DC comb fingers were assembled to an initial angle above the substrate plane due to the surface tension of the reflowed hinges. In the final process step of metallization, shorting between adjacent comb fingers does not arise because of the trench isolation around each finger.

The preferred BCB polymer utilized in the fabrication process is a material that is traditionally used in millimeter-wave integrated circuit (MMIC) technology for planarization or as a dielectric material, but it previously has not been used for self-assembly in MEMS fabrication. BCB polymers offer many important features that photoresist lacks. It is more resistant than photoresist towards acids and solvents that are commonly used in microfabrication. This allows us to release the devices in pure hydrofluoric acid without fear of degradation or delamination of the hinges. In fact, uncured BCB can withstand prolonged exposure to HF and isopropanol alcohol without signs of deterioration in contrast to that of photoresist where delamination of the film in HF is well documented. Furthermore, since BCB is a negative resist, there is no problem with the removal of trapped BCB within the deep grooves of the etched silicon device layer. The unexposed BCB is removed in the developer including those in the silicon trenches.

Figure 22A:
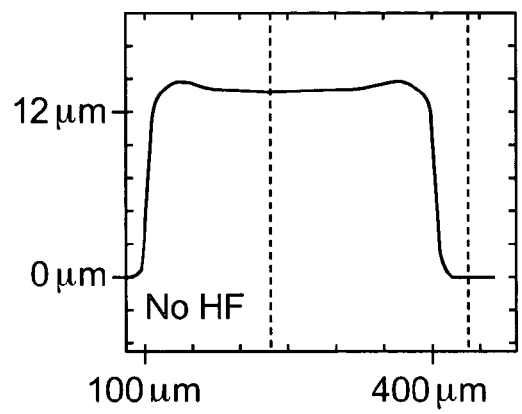
FIG. 22A–22D are cross-sectional views of surface profiles of BCB test structures utilized according to an aspect of the present invention, showing reflow of the edges of the BCB material as soaking time is increased from zero (FIG. 22A) through to eight minutes (FIG. 22D) in hydrofluoric acid (HF).
Figure 22B:
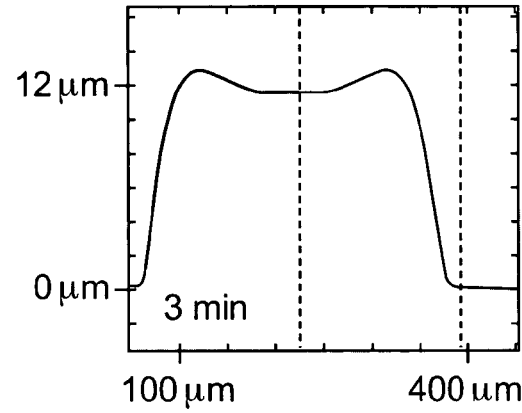
Figure 22C:
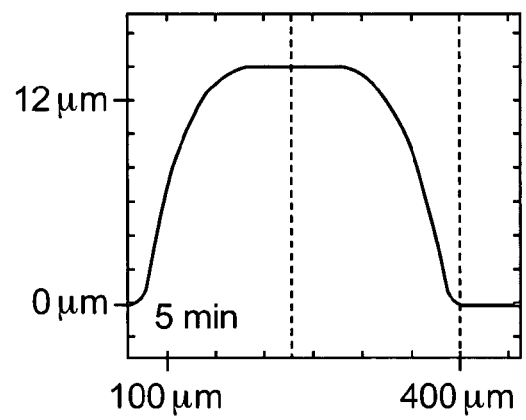
Figure 22D:
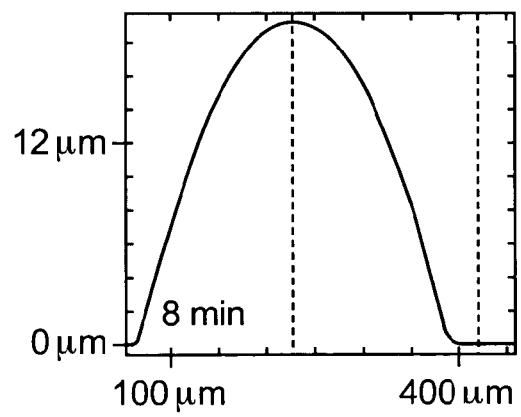

FIG. 22A through 22D depict different BCB flow tests. In these tests no evidence has been seen of reflow on test samples by curing BCB above its glass transition temperature. However, reflow is clearly evident when the resist comes in contact with HF even with fully cured BCB. The figures show the effects of HF on various circular test structures with 300 μm diameter and 12 μm height. In FIG. 22A without exposure to HF, the surface profile of the cured BCB remains cylindrical. With increasing soaking time, the edges of BCB start to reflow as seen in FIG. 22B and 22C. When BCB is soaked in HF for longer than 8 minutes, full reflow into a spherical shape was observed as seen in FIG. 22D.

During reflow, the surface tension pulls the suspended driving electrodes to its prescribed angle. This angle is determined by physical limiters that prevent further rotation above the designated angle. The suspended sensing comb fingers do not rotate out-of-plane because they are securely anchored at either side of the device by the torsion springs.

The driving electrodes for these test were assembled at 20 degrees, however, angles greater than the numerical aperture of the collecting optics (~15 degrees) are difficult to detect in our current experimental setup. The capacitance and the S parameters were measured with a microwave network analyzer and a high frequency coplanar waveguide probe with a ground signal-ground configuration. The measurements are calibrated for a one-port configuration.

Figure 23:
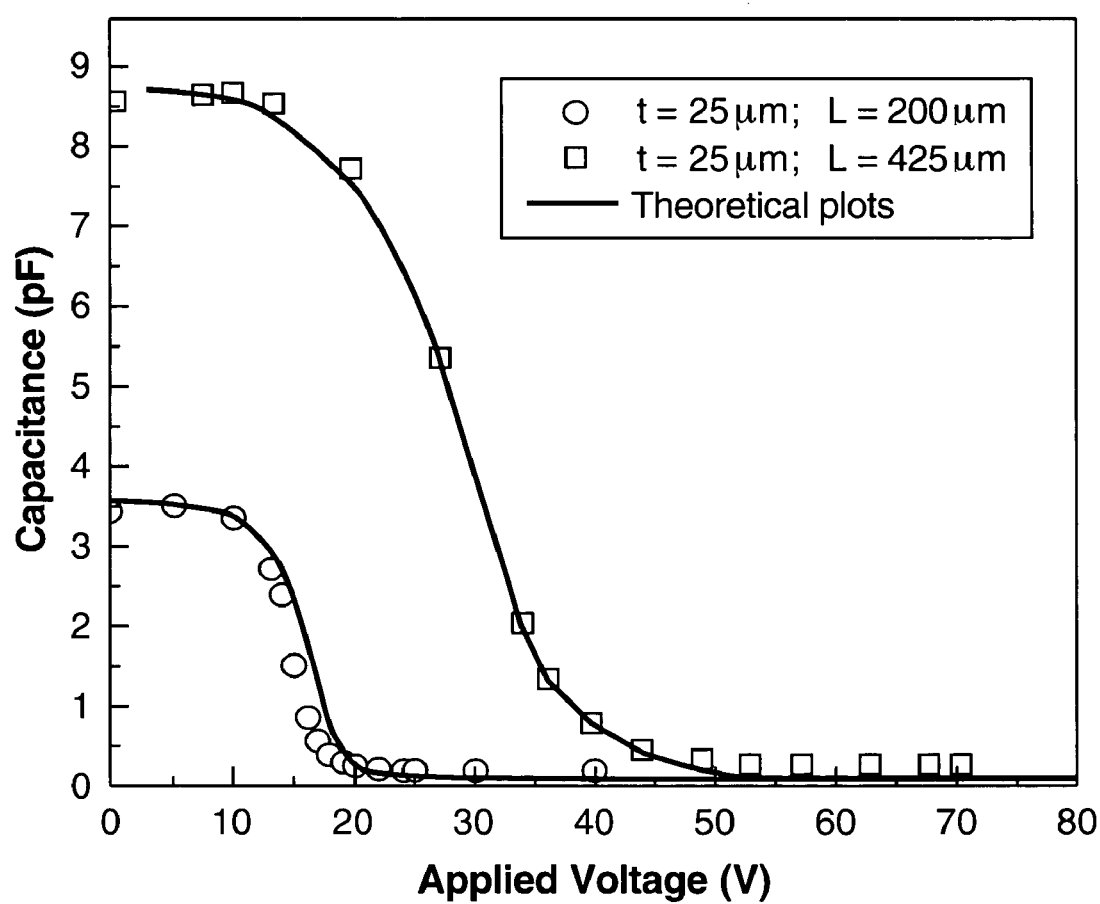
FIG. 23 is a plot of measured and calculated capacitance versus voltage for a 25 μm thick AVC tunable capacitor fabricated according to embodiments of the present invention with 200 μm and 425 μm length capacitance comb fingers.

FIG. 23 shows the measured and calculated capacitance versus voltage curves of the tunable capacitor with capacitor comb finger lengths (L) of 200 μm and 425 μm, respectively. The measurement data agrees well with the finite element analysis. The tuning range for the 200 μm and 425 μm finger lengths are 1680% and 3000% respectively.

This result exceeds our previous device (320%) that was built on a 10 μm thick SOI. The 200 μm comb fingers yield a maximum capacitance of 3.4 pF and a minimum capacitance of 0.2 pF. The longer (4250 μm) comb fingers increase the maximum capacitance to 8.6 pF with a minimum value at 0.27 pF. The increase in the operating voltage in the longer comb device is due to the wider springs employed to reduce the risk of breakage when the device is released.

Figure 24:
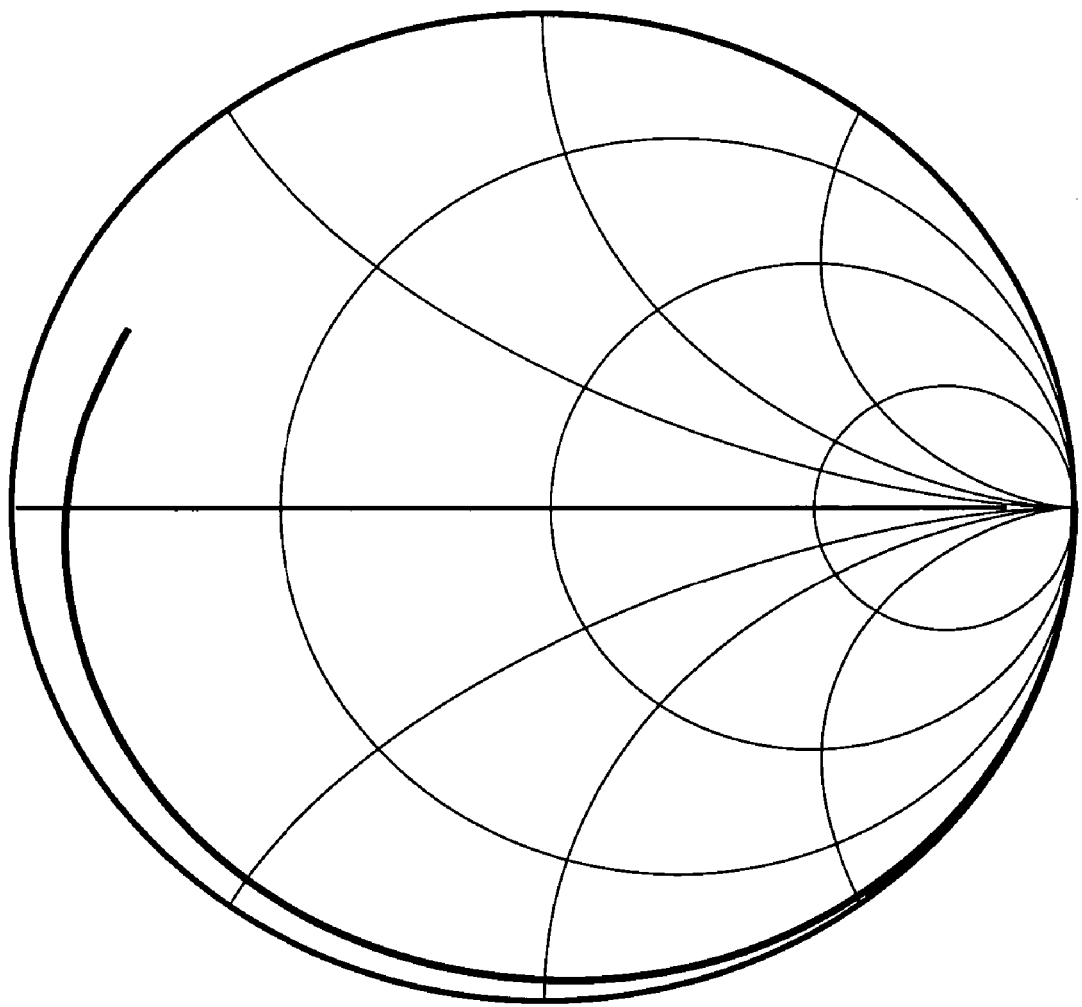
FIG. 24 is a Smith plot of maximum capacitance across a range of frequencies for an AVC tuning capacitor according to an embodiment of the present invention having 425 μm long comb fingers.
Figure 25:
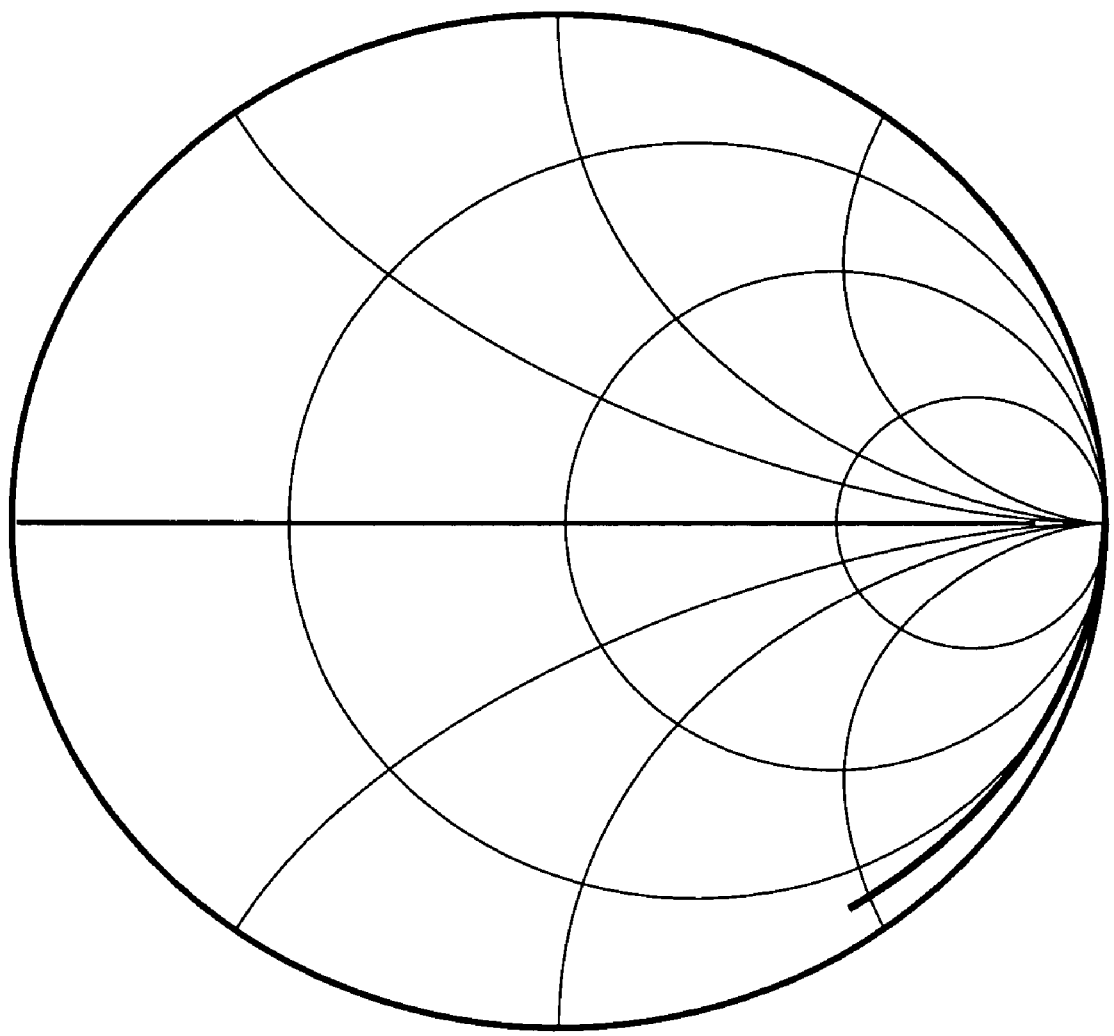
FIG. 25 is a Smith plot of minimum capacitance across a range of frequencies for an AVC tuning capacitor according to an embodiment of the present invention having 425 μm long comb fingers.

FIG. 24 and FIG. 25 depict the S11 parameter of the device with 425 μm long comb fingers at the maximum (FIG. 24) and the minimum capacitance (FIG. 25), respectively. The frequency sweep ranges from 45 MHz to 5 GHz. The thickness of the sputtered aluminum coating is approximately 8000 Å. The quality factor Q is calculated by extrapolating the impedance values with respect to frequency from the network analyzer.

Figure 26:
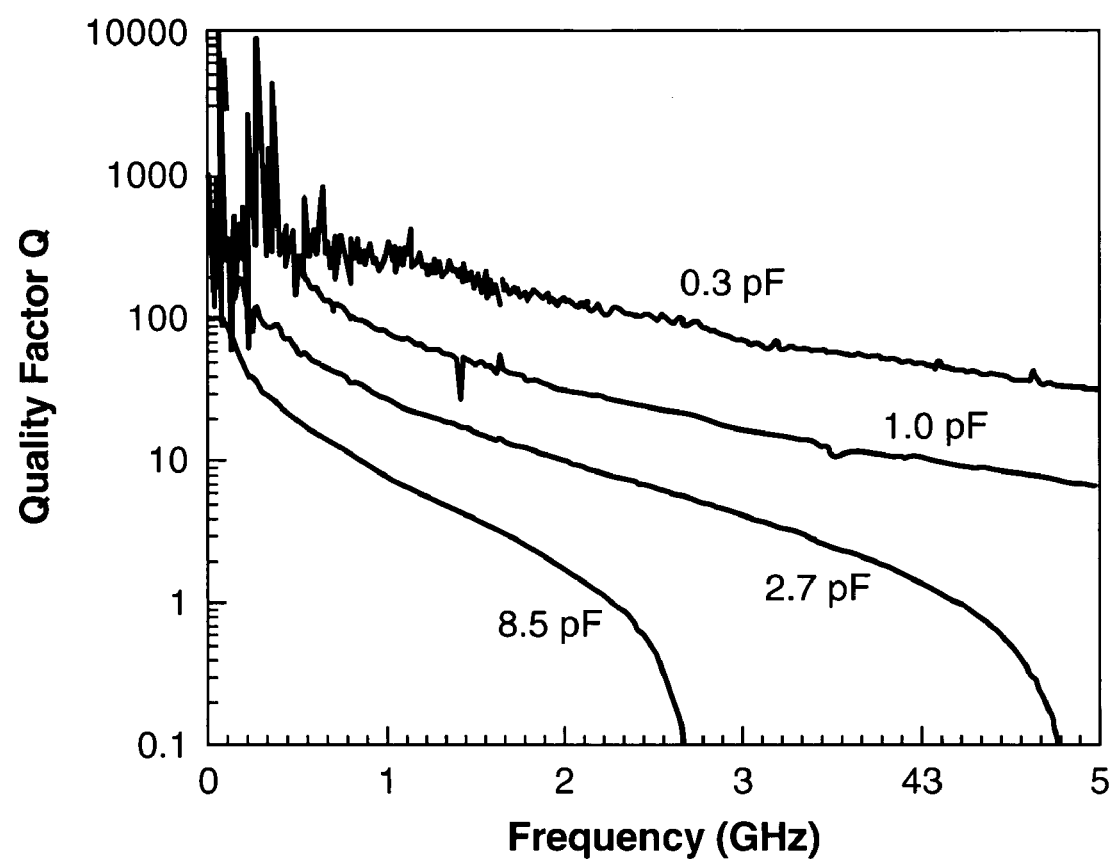
FIG. 26 is a plot of quality factor versus frequency for an AVC tunable capacitor at capacitance values between 0.3 pF to 8.5 pF according to an embodiment of the present invention.

FIG. 26 is a plot of the maximum attainable quality factor for capacitance values between 0.3 pF and 8.5 pF for this embodiment. Quality factor can be calculated from either impedance Z or S11 value.

$$Q = \frac{\text{Im}(Z)}{\text{Re}(Z)} = \frac{2 \text{ Im}(S_{11})}{1 - |S_{11}|^2} \tag{10}$$

The Q was measured at 273 at 0.3 pF at 1 GHz. Increasing the metal thickness or utilizing all-metal electrode fingers would further increase the Q factor.

It should also be appreciated that the dimensions of the elements and material composition and thickness can be varied while a number of alternative embodiments can be created according to the teachings herein without departing from the present invention. For example, different forms of actuator may be utilized for driving the rotation of the movable comb. In addition, the use of multiple combs (i.e. stationary and/or movable) is possible for the RF comb and/or the actuator, to provide added range of motion (i.e. on actuator comb) or a multiple response (i.e. on capacitive comb).

The present invention provides a novel MEMS tunable capacitor with angular vertical comb drive actuators, whose successful fabrication has been demonstrated. The device provides continuous tuning without pull-in with a 3000% continuous tuning range over a tuning range from 0.27 pF to 8.6 pF and a high quality factor across its capacitance range. It should be appreciated that tuning capacitors can be fabricated according to the teachings of the present invention which exhibit various capacitances, tuning ranges and other characteristics suited to a number of applications.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A tunable capacitor, comprising:
   a first plurality of spaced apart electrode fingers;
   a second plurality of spaced apart electrode fingers;
   a rotational coupling configured for positioning said first plurality of electrode fingers across a range of angular relationships with said second plurality of electrode fingers including at least one interposed position; and
   means for rotationally moving said electrode fingers between a position wherein said electrode fingers and said electrodes are interdigitated and a position in which they are substantially non-interdigitated.

2. A capacitor as recited in claim 1, wherein said first and second plurality of electrode fingers are coupled to one another through a hinge.

3. A capacitor as recited in claim 1, wherein said means for rotationally moving said electrode fingers comprises a driving element which applies a force against a mechanical biasing element.

4. A capacitor as recited in claim 3, wherein said mechanical biasing element comprises a torsional spring element coupled to said second plurality of electrode fingers.

5. A capacitor as recited in claim 3, wherein said driving element comprises a separate actuator or an electrostatic actuator formed from said first and second electrode fingers which generates a driving force in response to the application of a DC biasing current.

6. A capacitor as recited in claim 1, wherein the combination of said electrode fingers and said rotational coupling are configured to respond to a sufficient bias voltage applied between said first and second plurality of electrode fingers by changing the angular relationship and extent of interdigitation between said first and second plurality of electrode fingers.

7. A capacitor as recited in claim 1, wherein said means for rotationally moving comprises an electrical actuator configured for driving said electrode fingers between said interdigitated and said non-interdigitated positions.

8. A capacitor as recited in claim 7, wherein said electrical actuator comprises:
   a third plurality of electrode fingers;
   a fourth plurality of electrode fingers;
   wherein said third or fourth plurality of electrode fingers are mechanically coupled to said first or said second plurality of electrode fingers;
   wherein said first and second plurality of electrode fingers are configured to change their angular relationship with one another and the extent of interdigitation in response to the drive voltage applied between said third and fourth plurality of electrode fingers.

9. A capacitor as recited in claim 1 wherein said means for rotationally moving said electrode fingers between said interdigitated and said non-interdigitated positions comprises:
   a substrate base;
   a third plurality of electrode fingers attached to said substrate base;
   a fourth plurality of electrode fingers configured for interposition between said third plurality of electrode fingers; and
   a hinge coupled between said second and fourth plurality of electrode fingers;
   wherein said second electrode fingers are angularly offset from said fourth electrode fingers in relation to said substrate base;
   wherein said third and fourth plurality of electrode fingers are configured for moving between an non-interdigitated position to en interdigitated position in response to the application of a sufficient drive voltage;
   wherein movement of said fourth plurality of electrode fingers between said non-interdigitated and said interdigitated positions drives said second plurality of electrode fingers between an interdigitated position and a non-interdigitated position.

10. A tunable capacitor, comprising:
    a first pair of interdigitating electrode combs;
    a second pair of interdigitating electrode combs; and
    a rotational coupling configured for mechanically altering the angular relationship of said first pair of electrode combs in response to a voltage applied across said second pair of electrode combs;
    wherein the extent of interdigitation of said first pair of electrode combs is controlled in response to a voltage applied between the electrode combs in said second pair of electrode combs.

11. A capacitor as recited in claim 10, wherein each pair of interdigitating electrode combs comprises a stationary electrode comb having a plurality of elongated electrode fingers, and a movable electrode comb having a plurality of elongated electrode fingers of a shape and size for being interposed between the elongated electrode fingers of the stationary electrode comb.

12. A capacitor as recited in claim 11, wherein said movable electrode combs of said first and said second pairs of interdigitating electrode combs are joined through a hinge.

13. A capacitor as recited in claim 12, wherein said hinge comprises a BOB polymer (Cyclotene).

14. A capacitor as recited in claim 13, wherein said BCB hinge is cured during the assembly process for selling the angle between the two movable electrode combs.

15. A capacitor as recited in claim 10, wherein said first and second pair of electrode combs were etched from a substrate material and coated with a conductive material.

16. A capacitor as recited in claim 15, wherein said substrate material comprises a silicon layer over a glass base material.

17. A capacitor as recited in claim 15:
wherein said silicon layer is the top layer of an SOI wafer after the base material and intermediate insulation layer have been removed;
wherein said glass comprises a borosilicate glass.

18. A tunable capacitor, comprising:
a set of sensing electrodes; and
a set of driving electrodes;
wherein said sensing electrodes and said driving electrodes each include a plurality of electrode fingers;
wherein said driving electrode fingers are movable between an non-interdigitated position and an interdigitated position;
wherein said sensing electrode fingers are movable between an interdigitated position and a non-interdigitated position; and
wherein movement of said driving electrode fingers between said non-interdigitated and said interdigitated positions causes movement of said sensing electrode fingers between said interdigitated and said non-interdigitated positions.

19. A capacitor as recited in claim 18, wherein said driving electrode fingers are movable between said non-interdigitated position and said interdigitated position in response to a voltage bias applied to said set of driving electrodes.

20. A capacitor as recited in claim 18, wherein said capacitor exhibits maximum capacitance when said sensing electrode fingers are in an interdigitated position.

21. A tunable capacitor, comprising:
a substrate base;
a driving electrode, comprising
a plurality of stationary spaced apart driving electrode fingers attached to said substrate base,
a plurality of movable spaced apart driving electrode fingers configured for positioning between said stationary driving electrode fingers;
a sensing electrode, comprising
a plurality of stationary spaced apart sensing electrode fingers attached to said substrate base,
a plurality of movable spaced apart sensing electrode fingers configured for positioning between said stationary sensing electrode fingers; and
a hinge coupled between said movable electrode fingers of said sensing electrode and said movable electrode fingers of said driving electrode;
wherein said sensing electrode fingers are angularly offset from said driving electrode fingers in relation to said substrate base;
wherein said driving electrode fingers are movable between an interdigitated position in relation to said driving electrodes and a non-interdigitated position;
wherein said sensing electrode fingers are movable between an interdigitated position in relation to said sensing electrodes and a non-interdigitated position; and
wherein movement of said driving electrode fingers between said interdigitated and said non-interdigitated positions causes movement of said sensing electrode fingers between said non-interdigitated and said interdigitated positions.

22. A capacitor as recited in claim 21, wherein said driving electrode fingers are configured for moving between said non-interdigitated position and said interdigitated position in response to electrostatic forces from a drive voltage applied between said movable and said stationary driving electrodes fingers.

23. A capacitor as recited in claim 21, wherein said capacitor exhibits maximum capacitance when said sensing electrode fingers are in an interdigitated position.

24. A tunable capacitor, comprising:
a first plurality of spaced apart electrode fingers;
a second plurality of spaced apart electrode fingers configured for interdigitated positioning between said first plurality of electrode fingers; and
a rotational coupling connecting said first and said second plurality of electrode fingers and configured for moving said electrode fingers between a position wherein said electrode fingers and said electrodes are interdigitated and a position in which they are substantially non-interdigitated;
wherein the combination of said electrode fingers and said rotational coupling are configured to respond to a sufficient bias voltage applied between said first and second plurality of electrode fingers by changing the angular relationship and extent of interdigitation between said first and second plurality of electrode fingers.

25. A capacitor as recited in claim 24, wherein said first and second plurality of electrode fingers are coupled to one another through a hinge.

26. A capacitor as recited in claim 24, wherein said means for moving said electrode fingers comprises a driving element which applies a force against a mechanical biasing element.

27. A capacitor as recited in claim 26, wherein said mechanical biasing element comprises a torsional spring element coupled to said second plurality of electrode fingers.

28. A capacitor as recited in claim 26, wherein said driving element comprises a separate actuator or an electrostatic actuator formed from said first and second electrode fingers which generates a driving force in response to the application of a DC biasing current.

* * * * *